US011889633B2

(12) United States Patent
Krietzman et al.

(10) Patent No.: US 11,889,633 B2
(45) Date of Patent: *Jan. 30, 2024

(54) HEADER PANEL ASSEMBLY FOR PREVENTING AIR CIRCULATION ABOVE ELECTRONIC EQUIPMENT ENCLOSURE

(71) Applicant: CHATSWORTH PRODUCTS, INC., Agoura Hills, CA (US)

(72) Inventors: William Krietzman, Hauser, ID (US); Jose Arturo Garza, Jr., Pflugerville, TX (US); Richard Evans Lewis, II, Austin, TX (US)

(73) Assignee: Chatsworth Products, Inc., Simi Valley, CA (US)

( * ) Notice: Subject to any disclaimer, the term of this patent is extended or adjusted under 35 U.S.C. 154(b) by 514 days.

This patent is subject to a terminal disclaimer.

(21) Appl. No.: 17/181,738

(22) Filed: Feb. 22, 2021

(65) Prior Publication Data

US 2021/0176905 A1    Jun. 10, 2021

Related U.S. Application Data

(63) Continuation of application No. 16/792,611, filed on Feb. 17, 2020, now Pat. No. 10,932,400, which is a
(Continued)

(51) Int. Cl.
*H05K 13/04* (2006.01)

(52) U.S. Cl.
CPC ........ *H05K 13/04* (2013.01); *Y10T 29/49826* (2015.01)

(58) Field of Classification Search
CPC ............... H05K 13/04; H05K 7/20745; Y10T 29/49826
(Continued)

(56) References Cited

U.S. PATENT DOCUMENTS 2,766,861 A    10/1956   Abramson
3,192,306 A     6/1965   Skonnord
(Continued)

FOREIGN PATENT DOCUMENTS

AU    2008254682         11/2012
DE       2509487 A1       9/1976
(Continued)

OTHER PUBLICATIONS

Information Disclosure Statement (IDS) Letter Regarding Common Patent Application(s), dated Oct. 21, 2021.
(Continued)

*Primary Examiner* — Allen R. B. Schult
(74) *Attorney, Agent, or Firm* — Tillman Wright, PLLC; James D. Wright; David R. Higgins

(57) ABSTRACT

A hot/cold aisle air containment system includes a frame structure, at least one electronic equipment enclosure installed at least partially within the frame structure, and a header panel assembly. The frame structure adapted to be at least partially covered by one or more panels to define an interior space and includes at least one horizontal member. The header panel assembly is installed between a top of the at least one electronic equipment enclosure and the at least one horizontal member of the frame structure to prevent circulation of air above the enclosure. The header panel assembly includes a pair of panels. A first of the pair of panels is adjustable horizontally relative to a second of the pair of panels, and the pair of panels, together, are adjustable vertically relative to the least one horizontal member.

20 Claims, 29 Drawing Sheets

Related U.S. Application Data continuation of application No. 15/955,954, filed on Apr. 18, 2018, now Pat. No. 10,568,246, which is a continuation of application No. 13/763,699, filed on Feb. 10, 2013, now Pat. No. 9,955,616, which is a continuation-in-part of application No. 13/291,861, filed on Nov. 8, 2011, now Pat. No. 9,313,927.

(60) Provisional application No. 61/597,287, filed on Feb. 10, 2012, provisional application No. 61/411,359, filed on Nov. 8, 2010, provisional application No. 61/411,373, filed on Nov. 8, 2010.

(58) Field of Classification Search
USPC .................................................. 454/184
See application file for complete search history.

(56) References Cited

U.S. PATENT DOCUMENTS

| | | | |
|---|---|---|---|
| 3,362,403 | A | 1/1968 | Fleming et al. |
| 3,364,838 | A | 1/1968 | Bradley |
| 3,374,821 | A | 3/1968 | White |
| 3,407,016 | A | 10/1968 | Kronenberger |
| 3,493,237 | A | 2/1970 | Kleindienst |
| 3,507,085 | A | 4/1970 | Kruschwitz |
| 3,665,646 | A | 5/1972 | Neimanns |
| 3,707,060 | A | 12/1972 | Jansen, Jr. |
| 3,787,922 | A | 1/1974 | Foy et al. |
| 3,789,567 | A | 2/1974 | Rae et al. |
| 4,007,941 | A | 2/1977 | Stancati |
| 4,186,539 | A | 2/1980 | Harmon et al. |
| 4,218,079 | A | 8/1980 | Arnoldt |
| 4,495,234 | A | 1/1985 | Tominaga et al. |
| 4,495,545 | A | 1/1985 | Dufresne et al. |
| 4,496,186 | A | 1/1985 | Tuchiya et al. |
| 4,522,669 | A | 6/1985 | Nordin et al. |
| 4,635,422 | A | 1/1987 | Nowack et al. |
| 4,745,016 | A | 5/1988 | Hashimoto et al. |
| 4,778,705 | A | 10/1988 | Kuwabara |
| 4,782,245 | A | 11/1988 | Henry |
| 4,791,980 | A | 12/1988 | Hagar et al. |
| 4,852,317 | A | 8/1989 | Schiavello et al. |
| 4,859,143 | A | 8/1989 | Larrabee et al. |
| 4,895,378 | A | 1/1990 | Newquist et al. |
| 4,999,951 | A | 3/1991 | Keys et al. |
| 5,020,866 | A | 6/1991 | McIlwraith |
| 5,107,622 | A | 4/1992 | Fuchs et al. |
| 5,147,121 | A | 9/1992 | McIlwraith |
| RE34,393 | E | 9/1993 | McIlwraith |
| 5,279,782 | A | 1/1994 | Yamamoto et al. |
| 5,361,542 | A | 11/1994 | Dettloff |
| 5,488,543 | A | 1/1996 | Mazura et al. |
| 5,528,454 | A | 6/1996 | Niklos |
| 5,544,012 | A | 8/1996 | Koike |
| 5,545,845 | A | 8/1996 | Flores |
| 5,570,740 | A | 11/1996 | Flores et al. |
| 5,695,263 | A | 12/1997 | Simon et al. |
| 5,851,143 | A | 12/1998 | Hamid |
| 5,927,368 | A | 7/1999 | Rohrer et al. |
| 5,938,302 | A | 8/1999 | Anderson et al. |
| 5,954,301 | A | 9/1999 | Joseph et al. |
| 5,957,506 | A | 9/1999 | Stepp |
| 5,997,117 | A | 12/1999 | Krietzman |
| 6,034,873 | A | 3/2000 | Stahl et al. |
| 6,044,193 | A | 3/2000 | Szetesi et al. |
| 6,070,363 | A | 6/2000 | Vance |
| 6,104,003 | A | 8/2000 | Jones |
| 6,127,663 | A | 10/2000 | Jones |
| 6,181,557 | B1 | 1/2001 | Gatti |
| 6,185,098 | B1 | 2/2001 | Benavides |
| 6,198,628 | B1 | 3/2001 | Smith |
| 6,222,729 | B1 | 4/2001 | Yoshikawa |
| 6,238,029 | B1 | 5/2001 | Marzec et al. |
| 6,321,490 | B1 | 11/2001 | Vance |
| 6,336,691 | B1 | 1/2002 | Maroney et al. |
| 6,381,147 | B1 | 4/2002 | Hayward et al. |
| 6,401,940 | B1 | 6/2002 | Hartel et al. |
| 6,410,844 | B1 | 6/2002 | Bruner et al. |
| 6,513,770 | B1 | 2/2003 | Franz et al. |
| 6,554,697 | B1 | 4/2003 | Koplin |
| 6,601,932 | B1 | 8/2003 | Helgenberg et al. |
| 6,611,428 | B1 | 8/2003 | Wong |
| 6,616,524 | B2 | 9/2003 | Storck, Jr. et al. |
| 6,652,373 | B2 | 11/2003 | Sharp et al. |
| 6,672,955 | B2 | 1/2004 | Charron |
| 6,695,149 | B1 | 2/2004 | Cote et al. |
| 6,788,535 | B2 | 9/2004 | Dodgen et al. |
| 6,831,225 | B2 | 12/2004 | Chandler |
| 6,859,366 | B2 | 2/2005 | Fink |
| 6,867,967 | B2 | 3/2005 | Mok |
| 6,980,433 | B2 | 12/2005 | Fink |
| 7,011,576 | B2 | 3/2006 | Sharp et al. |
| 7,033,267 | B2 | 4/2006 | Rasmussen |
| 7,046,514 | B2 | 5/2006 | Fink et al. |
| 7,074,123 | B2 | 7/2006 | Bettridge et al. |
| 7,112,131 | B2 | 9/2006 | Rasmussen et al. |
| 7,144,320 | B2 | 12/2006 | Turek et al. |
| 7,145,772 | B2 | 12/2006 | Fink |
| 7,173,820 | B2 | 2/2007 | Fink et al. |
| 7,226,353 | B2 | 6/2007 | Bettridge et al. |
| 7,255,640 | B2 | 8/2007 | Aldag et al. |
| 7,259,963 | B2 | 8/2007 | Germagian et al. |
| 7,286,345 | B2 | 10/2007 | Casebolt |
| 7,293,666 | B2 | 11/2007 | Mattlin et al. |
| 7,349,209 | B2 | 3/2008 | Campbell et al. |
| 7,425,678 | B2 | 9/2008 | Adducci et al. |
| 7,427,713 | B2 | 9/2008 | Adducci et al. |
| 7,438,638 | B2 | 10/2008 | Lewis, II et al. |
| 7,472,970 | B2 | 1/2009 | Bergesch et al. |
| 7,476,804 | B2 | 1/2009 | Adducci et al. |
| 7,485,803 | B2 | 2/2009 | Adducci et al. |
| 7,486,512 | B2 | 2/2009 | Campbell et al. |
| 7,495,169 | B2 | 2/2009 | Adducci et al. |
| 7,498,512 | B2 | 3/2009 | Adducci et al. |
| 7,500,911 | B2 | 3/2009 | Johnson et al. |
| 7,504,581 | B2 | 3/2009 | Adducci et al. |
| 7,506,768 | B2 | 3/2009 | Rassmussen et al. |
| 7,529,086 | B2 | 5/2009 | Fink et al. |
| 7,542,287 | B2 | 6/2009 | Lewis, II et al. |
| 7,604,535 | B2 | 10/2009 | Germagian et al. |
| 7,643,291 | B2 | 1/2010 | Mallia et al. |
| 7,656,660 | B2 | 2/2010 | Hoeft et al. |
| 7,684,193 | B2 | 3/2010 | Fink et al. |
| 7,697,285 | B2 | 4/2010 | Donowho et al. |
| 7,718,891 | B2 | 5/2010 | Adducci et al. |
| 7,746,637 | B2 | 6/2010 | Donowho et al. |
| 7,751,188 | B1 | 7/2010 | French et al. |
| 7,752,858 | B2 | 7/2010 | Johnson et al. |
| 7,764,495 | B2 | 7/2010 | Iruby et al. |
| 7,772,489 | B2 | 8/2010 | Adducci et al. |
| 7,795,532 | B2 | 9/2010 | Walker |
| 7,804,685 | B2 | 9/2010 | Krietzman |
| 7,824,814 | B2 | 11/2010 | Suzuki et al. |
| 7,839,635 | B2 | 11/2010 | Donowho et al. |
| 7,878,888 | B2 | 2/2011 | Rasmussen et al. |
| 7,880,084 | B2 | 2/2011 | Adducci et al. |
| 7,881,057 | B2 | 2/2011 | Fink et al. |
| 7,894,190 | B2 | 2/2011 | Davis et al. |
| 7,895,855 | B2 | 3/2011 | Gooch |
| 7,944,692 | B2 | 5/2011 | Grantham et al. |
| 7,952,869 | B2 | 5/2011 | Lewis, II et al. |
| 7,957,139 | B2 | 6/2011 | Davis et al. |
| 7,974,105 | B2 | 7/2011 | Dean, Jr. et al. |
| 8,035,965 | B2 | 10/2011 | Adducci et al. |
| 8,040,673 | B2 | 10/2011 | Krietzman |
| 8,087,979 | B2 | 1/2012 | Rasmussen |
| 8,257,155 | B2 | 9/2012 | Lewis, II |
| 8,395,046 | B2 | 3/2013 | Nicewicz et al. |
| 8,403,736 | B2 | 3/2013 | Rasmussen et al. |
| 8,405,984 | B2 | 3/2013 | Donowho et al. |
| 8,411,465 | B2 | 4/2013 | Dean, Jr. et al. |
| 8,425,287 | B2 | 4/2013 | Wexler |
| 8,437,147 | B2 | 5/2013 | Dean, Jr. et al. |

(56) References Cited

U.S. PATENT DOCUMENTS

| | | |
|---|---|---|
| 8,459,756 B2 | 6/2013 | Tinhares et al. |
| 8,523,643 B1 | 9/2013 | Roy |
| 8,533,999 B2 | 9/2013 | Otsuka et al. |
| 8,628,158 B2 | 1/2014 | Caveney |
| 8,653,363 B2 | 2/2014 | Behrens et al. |
| 8,701,737 B2 | 4/2014 | Mainers et al. |
| 8,730,665 B2 | 5/2014 | Lewis, II et al. |
| 8,867,206 B2 | 10/2014 | Hruby et al. |
| 9,066,450 B2 | 6/2015 | Bednarcik et al. |
| 9,072,200 B2 | 6/2015 | Dersch et al. |
| 9,119,329 B2 | 8/2015 | Krietzman et al. |
| 9,185,824 B2 | 11/2015 | Nordin et al. |
| 9,313,927 B2 | 4/2016 | Krietzman |
| 9,332,863 B2 | 5/2016 | Ramey et al. |
| 9,380,735 B2 | 6/2016 | Chang |
| 9,560,777 B2 | 1/2017 | Krietzman et al. |
| 9,572,286 B2 | 2/2017 | Greeson et al. |
| 9,585,266 B2 | 2/2017 | Krietzman et al. |
| 9,655,259 B2 | 5/2017 | North et al. |
| 9,795,060 B2 | 10/2017 | Greeson et al. |
| 9,943,003 B2 | 4/2018 | Segroves et al. |
| 9,955,616 B2 | 4/2018 | Krietzman et al. |
| 10,133,320 B2 | 11/2018 | Lewis, II et al. |
| 10,182,651 B2 | 1/2019 | Jost et al. |
| 10,306,812 B2 | 5/2019 | Krietzman |
| 10,375,861 B2 | 8/2019 | Greeson et al. |
| 10,440,847 B2 | 10/2019 | Lewis, II et al. |
| 10,500,363 B2 | 12/2019 | Raje et al. |
| 10,568,239 B2 | 2/2020 | Krietzman et al. |
| 10,568,246 B2 | 2/2020 | Krietzman et al. |
| 10,595,442 B2 | 3/2020 | Davis |
| 10,624,232 B2 | 4/2020 | Krietzman |
| 10,709,039 B2 | 7/2020 | North et al. |
| 10,791,640 B2 | 9/2020 | Lewis, II et al. |
| 10,932,400 B2 | 2/2021 | Krietzman et al. |
| 11,166,395 B2 | 11/2021 | Krietzman |
| 11,212,928 B2 | 12/2021 | Lewis, II et al. |
| 11,444,438 B2 | 9/2022 | Schindler et al. |
| 11,622,469 B2 | 4/2023 | Waz et al. |
| 11,647,610 B2 | 5/2023 | Greeson et al. |
| 11,678,447 B2 | 6/2023 | Lewis, II et al. |
| 2002/0027377 A1 | 3/2002 | Nozaki |
| 2002/0153725 A1 | 10/2002 | Myers |
| 2003/0020379 A1 | 1/2003 | Larsen et al. |
| 2004/0190270 A1 | 9/2004 | Aldag et al. |
| 2005/0095374 A1 | 5/2005 | Cothran et al. |
| 2005/0168945 A1 | 8/2005 | Coglitore |
| 2005/0170770 A1 | 8/2005 | Johnson et al. |
| 2005/0207116 A1 | 9/2005 | Yatskov et al. |
| 2005/0248043 A1 | 11/2005 | Bettridge et al. |
| 2005/0259383 A1 | 11/2005 | Ewing |
| 2006/0082263 A1 | 4/2006 | Rimler et al. |
| 2006/0103270 A1 | 5/2006 | Bergesch et al. |
| 2006/0139877 A1 | 6/2006 | Germagian et al. |
| 2006/0141921 A1 | 6/2006 | Turek et al. |
| 2006/0260338 A1 | 11/2006 | VanGilder et al. |
| 2006/0276121 A1 | 12/2006 | Rasmussen |
| 2006/0283816 A1 | 12/2006 | Moore et al. |
| 2007/0064389 A1 | 3/2007 | Lewis, II et al. |
| 2007/0064391 A1 | 3/2007 | Lewis II et al. |
| 2007/0129000 A1 | 6/2007 | Rasmussen et al. |
| 2007/0171610 A1 | 7/2007 | Lewis |
| 2007/0171613 A1 | 7/2007 | McMahan et al. |
| 2007/0173189 A1 | 7/2007 | Lewis |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0293138 A1 | 12/2007 | Adducci et al. |
| 2008/0002358 A1 | 1/2008 | Casebolt |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0134745 A1 | 6/2008 | Hermanson |
| 2008/0174217 A1 | 7/2008 | Walker |
| 2008/0266789 A1 | 10/2008 | Hruby et al. |
| 2008/0316702 A1 | 12/2008 | Donowho et al. |
| 2008/0316703 A1 | 12/2008 | Donowho et al. |
| 2009/0059523 A1 | 3/2009 | Mallia et al. |
| 2009/0129013 A1 | 5/2009 | Donowho et al. |
| 2009/0173017 A1 | 7/2009 | Hall |
| 2009/0190307 A1 | 7/2009 | Krietzman |
| 2009/0227197 A1 | 9/2009 | Lewis, II et al. |
| 2009/0239460 A1 | 9/2009 | Lucia et al. |
| 2009/0239461 A1 | 9/2009 | Lewis, II et al. |
| 2009/0241578 A1 | 10/2009 | Carlson et al. |
| 2009/0273915 A1 | 11/2009 | Dean, Jr. et al. |
| 2009/0277605 A1 | 11/2009 | VanGilder et al. |
| 2010/0003911 A1 | 1/2010 | Graczyk et al. |
| 2010/0061057 A1 | 3/2010 | Dersch et al. |
| 2010/0061059 A1 | 3/2010 | Krietzman et al. |
| 2010/0172092 A1 | 7/2010 | Davis et al. |
| 2010/0172093 A1 | 7/2010 | Davis et al. |
| 2010/0178202 A1 | 7/2010 | Isobe et al. |
| 2010/0188816 A1 | 7/2010 | Bean et al. |
| 2010/0216388 A1 | 8/2010 | Tresh et al. |
| 2010/0307716 A1 | 12/2010 | Bean et al. |
| 2011/0011004 A1 | 1/2011 | Courrian et al. |
| 2011/0019362 A1 | 1/2011 | Krietzman |
| 2011/0072729 A1 | 3/2011 | Otsuka et al. |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0271610 A1 | 11/2011 | Cottuli et al. |
| 2011/0278999 A1 | 11/2011 | Caveney et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0080984 A1 | 4/2012 | Watts |
| 2012/0112612 A1 | 5/2012 | Krietzman |
| 2012/0181906 A1 | 7/2012 | Caveney |
| 2012/0292278 A1 | 11/2012 | Schluter et al. |
| 2013/0029579 A1 | 1/2013 | Lewis, II |
| 2013/0149954 A1 | 6/2013 | North et al. |
| 2013/0160271 A1 | 6/2013 | Krietzman et al. |
| 2013/0163185 A1 | 6/2013 | Gilges et al. |
| 2013/0165035 A1 | 6/2013 | Krietzman et al. |
| 2013/0210335 A1 | 8/2013 | Krietzman et al. |
| 2013/0276389 A1 | 10/2013 | Marrs et al. |
| 2014/0059941 A1 | 3/2014 | Brookman |
| 2014/0196394 A1 | 7/2014 | Greeson et al. |
| 2014/0311040 A1 | 10/2014 | One |
| 2015/0208554 A1 | 7/2015 | Leigh et al. |
| 2016/0088773 A1 | 3/2016 | Greeson et al. |
| 2016/0145927 A1 | 5/2016 | Hirakawa et al. |
| 2016/0249488 A1 | 8/2016 | Krietzman |
| 2016/0280153 A1 | 9/2016 | Filipczak et al. |
| 2017/0127569 A1 | 5/2017 | Rimler et al. |
| 2017/0142851 A1 | 5/2017 | Krietzman et al. |
| 2017/0150652 A1 | 5/2017 | Greeson et al. |
| 2017/0231119 A1 | 8/2017 | North et al. |
| 2017/0355253 A1 | 12/2017 | Ogawa et al. |
| 2018/0035570 A1 | 2/2018 | Greeson et al. |
| 2018/0242483 A1 | 8/2018 | Krietzman et al. |
| 2018/0370343 A1 | 12/2018 | Hiroe et al. |
| 2019/0031007 A1 | 1/2019 | Kamiya |
| 2019/0084209 A1 | 3/2019 | Hiroe et al. |
| 2019/0350110 A1 | 11/2019 | Krietzman |
| 2019/0359043 A1 | 11/2019 | Gollapalli et al. |
| 2020/0015375 A1 | 1/2020 | Krietzman et al. |
| 2020/0077533 A1 | 3/2020 | Lu et al. |
| 2020/0113074 A1 | 4/2020 | Lewis, II et al. |
| 2020/0229331 A1 | 7/2020 | Krietzman et al. |
| 2020/0323107 A1 | 10/2020 | North et al. |
| 2021/0014988 A1 | 1/2021 | Lewis, II et al. |
| 2021/0101460 A1 | 4/2021 | Zunzer et al. |
| 2021/0300164 A1 | 9/2021 | Kumar |
| 2022/0053672 A1 | 2/2022 | Krietzman |

(56) References Cited

U.S. PATENT DOCUMENTS

| | | |
|---|---|---|
| 2022/0061188 A1 | 2/2022 | Greeson et al. |
| 2022/0124924 A1 | 4/2022 | Lewis, II et al. |

FOREIGN PATENT DOCUMENTS

| | | |
|---|---|---|
| EP | 2205054 A1 | 7/2010 |
| GB | 2354066 A | 3/2001 |
| GB | 2366084 B | 9/2002 |
| TW | 201630514 A | 8/2016 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009103090 A2 | 8/2009 |
| WO | 2009103090 A3 | 10/2009 |
| WO | 2010028384 A2 | 3/2010 |
| WO | 2010028384 A3 | 5/2010 |
| WO | 2010117699 A1 | 10/2010 |
| WO | 2011088430 A2 | 7/2011 |
| WO | 2011088438 A2 | 7/2011 |
| WO | 2011088430 A3 | 11/2011 |
| WO | 2011088438 A3 | 11/2011 |

OTHER PUBLICATIONS

Information Disclosure Statement (IDS) Letter Regarding Common Patent Application(s), dated May 3, 2021.

Rasmussen, Neil, "Air Distribution Architecture Options for Mission Critical Facilities", White Paper #55, Revision 1, American Power Conversion (APC), West Kingston, Rhode Island, 2003 (13 pages).

Chatsworth Products, Inc., "Thermal Management Solutions," Signature Solutions Brochure, available at Internet Web Page <www.chatsworth.com/passivecooling>, dated Mar. 2008 (6 pages).

DCR Product Brochure, Configurations Options, accessed at www.datacenterinarow.com on or about Mar. 2011 (4 pages).

DCR Product Brochure, Self-Contained Data Center Configurations, accessed at www.datacenterinarow.com, on or about Mar. 2011 (2 pages).

DCR Product Brochure, Self-Contained Data Center Features, accessed at www.datacenterinarow.com, on or about Mar. 2011 (2 pages).

DCR Product Brochure, Top Ten Features, accessed at www.datacenterinarow.com, on or about Mar. 2011 (9 pages).

DCR Product Brochure, accessed at www.datacenterinarow.com, on or about Mar. 2011 (25 pages).

Emerson Network Power, Smart Cooling Solutions Data Center, Oct. 2012, Internet Web Page <http://www.emersonnetworkpower.com/en-EMEA/Products/RACKSANDINTEGRATEDCABINETS/Documents/Knurr%20DCD/Smart-Cooling-Solutions-Data-Center-EN.pdf> (51 pages).

Hewlett-Packard Development Company, LP, HP 10000 G2 42U Rack Air Duct Installation Guide, dated Aug. 2008 (23 pages).

Panduit Corporation, Panduit Net-Access Vertical Exhaust Duct (VED) Instructions, dated 2009 (4 pages).

Panduit Corporation, Panduit Net-Access Vertical Exhaust System (VES) Specification Sheet, dated 2011 (4 pages).

Chatsworth Products, Inc. "Cabinet Airflow Baffles—Air Dam Kit for CPI Cabinet Systems," Product Data Sheet, Jun. 2004 (2 pages).

HEADER PANEL ASSEMBLY FOR PREVENTING AIR CIRCULATION ABOVE ELECTRONIC EQUIPMENT ENCLOSURE

CROSS-REFERENCE TO RELATED APPLICATIONS

The present application is a U.S. continuation patent application of, and claims priority under 35 U.S.C. § 120 to, U.S. nonprovisional patent application Ser. No. 16/792,611, filed Feb. 17, 2020, which '611 application published as U.S. Patent Application Publication No. US 2020/0229331 A1 on Jul. 16, 2020 and issued as U.S. Pat. No. 10,932,400 on Feb. 23, 2021, which '611 application, the application publication thereof, and the patent issuing therefrom are each incorporated herein by reference in their entirety, and which '611 application is a U.S. continuation patent application of, and claims priority under 35 U.S.C. § 120 to, U.S. nonprovisional patent application Ser. No. 15/955,954, filed Apr. 18, 2018, which '954 application published as U.S. Patent Application Publication No. US 2018/0242483 A1 on Aug. 23, 2018 and issued as U.S. Pat. No. 10,568,246 on Feb. 18, 2020, which '954 application, the application publication thereof, and the patent issuing therefrom are each incorporated herein by reference in their entirety, and which '954 application is a U.S. continuation patent application of, and claims priority under 35 U.S.C. § 120 to, U.S. nonprovisional patent application Ser. No. 13/763,699, filed Feb. 10, 2013, which '699 application published as U.S. Patent Application Publication No. US 2013/0160271 A1 on Jun. 27, 2013 and issued as U.S. Pat. No. 9,955,616 on Apr. 24, 2018, which '699 application, the application publication thereof, and the patent issuing therefrom are each incorporated herein by reference in their entirety, and which '699 application is a U.S. nonprovisional patent application of, and claims priority under 35 U.S.C. § 119(e) to, U.S. provisional patent application Ser. No. 61/597,287, filed Feb. 10, 2012, which '287 application is incorporated herein by reference in its entirety, and which '699 application is a continuation-in-part of, and claims priority under 35 U.S.C. § 120 to, U.S. nonprovisional patent application Ser. No. 13/291,861, filed Nov. 8, 2011, which '861 application published as U.S. Patent Application Publication No. US 2012/0112612 A1 on May 10, 2012 and issued as U.S. Pat. No. 9,313,927 on Apr. 12, 2016, which '861 application, the application publication thereof, and the patent issuing therefrom are each incorporated herein by reference in their entirety, and which '861 application is a U.S. nonprovisional patent application of, and claims priority under 35 U.S.C. § 119(e) to, U.S. provisional patent application Ser. No. 61/411,359, filed Nov. 8, 2010, which '359 application is incorporated herein by reference in its entirety, and which '861 application is a U.S. nonprovisional patent application of, and claims priority under 35 U.S.C. § 119(e) to, U.S. provisional patent application Ser. No. 61/411,373, filed Nov. 8, 2010, which '373 application is incorporated herein by reference in its entirety. A copy of U.S. provisional patent application Ser. No. 61/411,359, filed Nov. 8, 2010, is attached hereto as Appendix A, which itself is expressly incorporated herein by reference. Additionally, each of the following commonly-assigned U.S. patent applications, including any application publication thereof, is expressly incorporated herein by reference in its entirety:

(a) U.S. provisional patent application Ser. No. 61/568,692, filed Dec. 9, 2011 and entitled, "DATA PROCESSING EQUIPMENT STRUCTURE;" and (b) U.S. nonprovisional patent application Ser. No. 13/707,521, filed Dec. 6, 2012 and entitled, "DATA PROCESSING EQUIPMENT STRUCTURE," which '521 application published as U.S. Patent Application Publication No. US 2013/0149954 A1 on Jun. 13, 2013.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to structures and methods of thermal management in a data center, and, in particular, to a header panel assembly for installation above electronic equipment enclosures in a hot/cold aisle air containment structure.

Background

Rack-mounted computer and data storage equipment generates heat during normal operation. When equipment is enclosed in racks, cabinets and other electronic equipment enclosures (hereinafter, collectively, referred to as "enclosures"), heat generated by the equipment can concentrate within the enclosure and cause equipment to overheat, which can damage the equipment, cause the equipment to shut down, and other problems. Thus, proper thermal management is a fundamental aspect of the installation and use of such equipment. Moreover, thermal management is particularly important in data centers in which multiple enclosures are installed, each with its own array of heat-generating equipment.

Many techniques and solutions have been proposed and used with regard to thermal management in such data centers. One such solution involves utilization of a containment structure to receive heated exhaust air from enclosures installed in the data center or computer room. Enclosures are typically arranged in a row with their sides abutting one another. Cool air is drawn into the enclosures from outside the containment structure to cool the equipment mounted in each enclosure. Heated exhaust air is then expelled from the enclosures into a common area within the containment structure, which is segregated from the supply of cool air. Heated exhaust air may then be routed from the containment structure and cooled before being re-circulated into the supply of cool air. (The opposite configuration can also be used, wherein cool air is supplied to the interior of the containment structure, drawn into the enclosures, and expelled to the exterior of the containment structure, but the same general principles apply.)

A common difficulty encountered in many known containment structures involves co-mingling of the heated exhaust air with the supply of cool air, which can impair the system's efficiency. Co-mingling can occur for a variety of reasons, but often arises when an enclosure has an imperfect fit within the containment structure, thereby creating a gap through which heated air can escape back into the supply of cool air. For example, a gap can exist between the top of an enclosure and a structure immediately above the enclosure (e.g., a ceiling, a top panel, etc). Air exhausted from the rear of the enclosure can circulate back over the enclosure, through the gap, and back to the front of the enclosure, where it co-mingles with the supply of cool air, instead of being captured by the containment structure's cooling system.

Additionally, openings or gaps in the containment structure may have the effect of causing equipment located near the gap to run at a higher operating temperature. When heated exhaust air escapes back into the supply of cool air through gaps, the heated air can be drawn back in to equipment located nearby, thereby raising the operating temperature of such equipment and shortening its operating life.

Further issues may arise if enclosures with varying dimensions are installed within the same containment structure. For example, if enclosures with different vertical dimensions happen to be installed adjacent to one another within the same containment structure, differently-sized panels or blanks must be used to seal off any gaps that are formed above the enclosures. If such panels do not provide a good fit to seal the gap, then inefficiency is likely to exist as heated exhaust air escapes from the containment structure and mixes with the supply of cool air.

Accordingly, a need exists for a containment system capable of avoiding co-mingling of heated exhaust air with the supply of cool air. Furthermore, a need exists for a containment system that enhances overall cooling efficiency. These, and other needs, are addressed by one or more aspects of the present invention.

SUMMARY OF THE PRESENT INVENTION

Broadly defined, the present invention according to a first aspect includes a hot/cold aisle containment system substantially as shown and described.

Broadly defined, the present invention according to a second aspect includes a hot/cold aisle containment system having a header panel assembly installed between a horizontal member thereof and an electronic equipment enclosure, substantially as shown and described.

Broadly defined, the present invention according to a third aspect includes a hot/cold aisle containment system. The containment system includes a frame structure, at least one electronic equipment enclosure installed at an end of the frame structure, and a header panel assembly. The frame structure is adapted to be at least partially covered by one or more panels to define an interior space and includes a vertical member and a horizontal member. The header panel assembly is installed between a top of the at least one electronic equipment enclosure and the horizontal member of the frame structure to prevent circulation of air above the enclosure.

In features of this aspect, the header panel assembly may include a main panel and at least one seal, the at least one seal being disposed along the lower edge of the main panel and adapted to be held in place between the bottom of the main panel and a top surface of the at least one electronic equipment enclosure; the at least one seal may be compressible; the header panel assembly may further include a fixed bracket adapted to be supported by the horizontal member of the frame structure, wherein the main panel is adapted to be adjustably coupled to the fixed bracket; the header panel assembly may further include at least one clamp for retaining a portion of the main panel against a portion of the fixed bracket; a V-shaped flange may be disposed at the lower edge of the main panel, wherein the at least one seal is disposed at least partially in a groove defined by the V-shaped flange; and/or a V-shaped flange may be disposed at a side edge of the main panel, wherein the at least one seal is disposed at least partially in a groove defined by the V-shaped flange.

In further features of this aspect, the hot/cold aisle containment system may further include a side seal assembly installed between a side of the at least one electronic equipment enclosure and the vertical member of the frame structure to prevent circulation of air around the enclosure; the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, wherein the at least one seal is disposed at least partially in a groove defined by the V-shaped flange; and/or the side seal assembly may be adapted to extend from the top to the bottom of the frame structure.

Broadly defined, the present invention according to a fourth aspect includes a hot/cold aisle containment system. The containment system includes a frame structure, at least one electronic equipment enclosure installed at an end of the frame structure, and a side seal assembly. The frame structure is adapted to be at least partially covered by one or more panels to define an interior space and includes a vertical member. The side seal assembly is installed between a side of the at least one electronic equipment enclosure and the vertical member of the frame structure to prevent circulation of air around the enclosure.

In features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; and/or a V-shaped flange may be disposed along an edge of the vertical support bracket, wherein the at least one seal is disposed at least partially in a groove defined by the V-shaped flange.

Broadly defined, the present invention according to a fifth aspect includes a hot/cold aisle containment system. The containment system includes a frame structure, a header panel assembly, a side seal assembly, and at least one electronic equipment enclosure. The frame structure is adapted to be at least partially covered by one or more panels to define an interior space and includes a vertical member and a horizontal member. The header panel assembly depends from the horizontal member of the frame structure, and the side seal assembly depends from the vertical member of the frame structure. The at least one electronic equipment enclosure is installed at least partially within the frame structure such that a top of the enclosure is sealed by the header panel assembly and a side of the enclosure is sealed by the side seal assembly.

In features of this aspect, the header panel assembly may include a main panel and at least one seal, the at least one seal being disposed along the lower edge of the main panel and adapted to be held in place between the bottom of the main panel and a top surface of the at least one electronic equipment enclosure; the at least one seal may be compressible; the header panel assembly may further include a fixed bracket adapted to be supported by the horizontal member of the frame structure, wherein the main panel is adapted to be adjustably coupled to the fixed bracket; the header panel assembly may further include at least one clamp for retaining a portion of the main panel against a portion of the fixed bracket; a V-shaped flange may be disposed at the lower edge of the main panel, wherein the at least one seal is disposed at least partially in a groove defined by the V-shaped flange; and/or a V-shaped flange may be disposed at a side edge of the main panel, wherein the at least one seal is disposed at least partially in a groove defined by the V-shaped flange.

In further features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, wherein the at least one seal is disposed at least partially in a groove defined by the V-shaped flange; and/or the side seal assembly may be adapted to extend from the top to the bottom of the frame structure.

Broadly defined, the present invention according to a sixth aspect includes a header panel assembly, for use in connection with a hot/cold aisle containment system, substantially as shown and described.

Broadly defined, the present invention according to a seventh aspect includes a header panel assembly. The header panel assembly includes a fixed bracket, adapted to be supported by a horizontal frame structure of a hot/cold aisle containment system; a main panel, having a lower edge, that is adjustably coupled to the fixed bracket; and a seal, disposed along the lower edge of the main panel, that is adapted to be held in place between the bottom of the main panel and a top surface of at least one electronic equipment enclosure installed beneath the header panel assembly.

In features of this aspect, the seal may be compressible; the header panel assembly may further include at least one clamp for retaining a portion of the main panel against a portion of the fixed bracket; a V-shaped flange may be disposed at the lower edge of the main panel, wherein the seal is disposed at least partially in a groove defined by the V-shaped flange; and/or the main panel may further include a side edge having an additional V-shaped flange, wherein an additional seal is disposed along the side edge at least partially in a groove defined by the additional V-shaped flange and is adapted to be held in place between the side of the main panel and an adjacent structure.

Broadly defined, the present invention according to an eighth aspect includes a header panel assembly. The header panel assembly includes a fixed bracket, adapted to be supported by a horizontal frame structure of a hot/cold aisle containment system; a main panel, having a side edge, that is adjustably coupled to the fixed bracket; and a seal, disposed along the side edge of the main panel, that is adapted to be held in place between the side of the main panel and an adjacent structure.

In features of this aspect, the seal may be compressible; a V-shaped flange may be disposed at the side edge of the main panel, wherein the seal is disposed at least partially in a groove defined by the V-shaped flange; and/or the adjacent structure may be a side seal assembly.

Broadly defined, the present invention according to a ninth aspect includes a side seal assembly, for use in connection with a hot/cold aisle containment system, substantially as shown and described.

Broadly defined, the present invention according to a tenth aspect includes a side seal assembly. The side seal assembly includes a vertical support bracket, adapted to be supported by a vertical frame structure of a hot/cold aisle containment system, that includes a V-shaped flange extending vertically along the side thereof; and a seal, disposed within a groove defined by the V-shaped flange, that is adapted to be held in place between the side of the vertical support bracket and an adjacent electronic equipment enclosure.

In features of this aspect, the seal may be compressible; and/or the vertical support bracket may include one or more horizontal slots to facilitate lateral adjustment thereof.

Broadly defined, the present invention according to an eleventh aspect includes a method of sealing a hot/cold aisle containment system as substantially shown and described.

Broadly defined, the present invention according to a twelfth aspect includes a hot/cold aisle containment system that includes a frame structure and at least one electronic equipment enclosure installed at least partially within the frame structure, and a header panel assembly. The frame structure is adapted to be at least partially covered by one or more panels to define an interior space. The frame structure includes a vertical member and a horizontal member. The header panel assembly is installed between a top of the at least one electronic equipment enclosure and the horizontal member of the frame structure to prevent circulation of air above the enclosure. The header panel assembly includes a main panel and at least one seal.

In features of this aspect, the at least one seal may be disposed along the lower edge of the main panel and adapted to be held in place between the bottom of the main panel and a top surface of the at least one electronic equipment enclosure; the at least one seal may be disposed along a side edge of the main panel and adapted to be held in place between the side of the main panel and an adjacent structure; the header panel assembly may further include a fixed bracket adapted to be supported by the horizontal member of the frame structure, and the main panel may be adapted to be adjustably coupled to the fixed bracket; and/or the header panel assembly may further include at least one clamp for retaining a portion of the main panel against a portion of the fixed bracket.

In further features of this aspect, a V-shaped flange may be disposed at an edge of the main panel, and the at least one seal may be disposed at least partially in a groove defined by the V-shaped flange; a generally perpendicular flange may be disposed at an edge of the main panel, and the at least one seal may be disposed along an outer edge of the generally perpendicular flange; and/or an angled flange may be disposed at an edge of the main panel, and the at least one seal may be disposed along an outer edge of the angled flange.

In still further features of this aspect, the at least one seal may be compressible; the at least one seal may be a brush seal; and/or the at least one seal may be a deflectable blade seal.

In still further features of this aspect, the hot/cold aisle containment system may further include a side seal assembly installed between a side of the at least one electronic equipment enclosure and the vertical member of the frame structure to prevent circulation of air around the enclosure; the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, and the at least one seal may be disposed at least partially in a groove defined by the V-shaped flange; and/or the side seal assembly may be adapted to extend from the top to the bottom of the frame structure.

In still another feature of this aspect, the main panel may be mounted to the horizontal member and adapted to be adjustable in a vertical direction relative to the horizontal member.

Broadly defined, the present invention according to a thirteenth aspect includes a hot/cold aisle containment system that includes a frame structure, at least one electronic equipment enclosure installed at least partially within the frame structure, and a side seal assembly. The frame structure is adapted to be at least partially covered by one or more panels to define an interior space, and the frame structure includes a vertical member. The side seal assembly is installed between a side of the at least one electronic equipment enclosure and the vertical member of the frame structure to prevent circulation of air around the enclosure.

In features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; and/or a V-shaped flange may be disposed along an edge of the vertical support bracket, and the at least one seal may be disposed at least partially in a groove defined by the V-shaped flange.

Broadly defined, the present invention according to a fourteenth aspect includes a hot/cold aisle containment system that includes a frame structure, a header panel assembly, a side seal assembly, and at least one electronic equipment enclosure installed at least partially within the frame structure. The frame structure is adapted to be at least partially covered by one or more panels to define an interior space, and the frame structure includes a vertical member and a horizontal member. The header panel assembly depends from the horizontal member of the frame structure, and the header panel assembly includes a main panel and at least one seal. The side seal assembly depends from the vertical member of the frame structure. The at least one electronic equipment enclosure is installed at least partially within the frame structure such that a top of the enclosure is sealed by the header panel assembly and a side of the enclosure is sealed by the side seal assembly.

In features of this aspect, the at least one seal may be disposed along the lower edge of the main panel and adapted to be held in place between the bottom of the main panel and a top surface of the at least one electronic equipment enclosure; the at least one seal may be disposed along a side edge of the main panel and adapted to be held in place between the side of the main panel and an adjacent structure; the header panel assembly may further include a fixed bracket adapted to be supported by the horizontal member of the frame structure, and the main panel may be adapted to be adjustably coupled to the fixed bracket; and/or the header panel assembly may further include at least one clamp for retaining a portion of the main panel against a portion of the fixed bracket.

In further features of this aspect, a V-shaped flange may be disposed at an edge of the main panel, and the at least one seal may be disposed at least partially in a groove defined by the V-shaped flange; a generally perpendicular flange may be disposed at an edge of the main panel, and the at least one seal may be disposed along an outer edge of the generally perpendicular flange; and/or an angled flange may be disposed at an edge of the main panel, and the at least one seal may be disposed along an outer edge of the angled flange.

In further features of this aspect, the at least one seal may be compressible; the at least one seal may be a brush seal; and/or the at least one seal may be a deflectable blade seal.

In further features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, and the at least one seal may be disposed at least partially in a groove defined by the V-shaped flange; and/or the side seal assembly may be adapted to extend from the top to the bottom of the frame structure.

In still another feature of this aspect, the main panel may be mounted to the horizontal member and adapted to be adjustable in a vertical direction relative to the horizontal member.

Broadly defined, the present invention according to a fifteenth aspect includes a header panel assembly that includes a fixed bracket, a main panel that is adjustably coupled to the fixed bracket, and at least one seal disposed along an edge of the main panel. The fixed bracket is adapted to be supported by a horizontal frame structure of a hot/cold aisle containment system. The at least one seal is adapted to be held in place between the main panel and an adjacent structure.

In a feature of this aspect, the header panel assembly may further include at least one clamp for retaining a portion of the main panel against a portion of the fixed bracket.

In further features of this aspect, a V-shaped flange may be disposed at an edge of the main panel, and the at least one seal may be disposed at least partially in a groove defined by the V-shaped flange; a generally perpendicular flange may be disposed at an edge of the main panel, and the at least one seal may be disposed along an outer edge of the generally perpendicular flange; and/or an angled flange may be disposed at an edge of the main panel, and the at least one seal may be disposed along an outer edge of the angled flange.

In still further features of this aspect, the at least one seal may be compressible; the at least one seal may be a brush seal; and/or the at least one seal may be a deflectable blade seal.

In still further features of this aspect, the at least one seal may be disposed along a lower edge of the main panel; and/or the at least one seal may be disposed along a side edge of the main panel.

In still further features of this aspect, the adjacent structure may be an electronic equipment enclosure; and/or the adjacent structure may be a side seal assembly.

Broadly defined, the present invention according to a sixteenth aspect includes a side seal assembly that includes a vertical support bracket and a seal. The vertical support bracket is adapted to be supported by a vertical frame structure of a hot/cold aisle containment system and includes a V-shaped flange extending vertically along the side thereof. The seal is disposed within a groove defined by the V-shaped flange and is adapted to be held in place between the side of the vertical support bracket and an adjacent electronic equipment enclosure.

In features of this aspect, the seal may be compressible; the seal may be a brush seal; and/or the seal may be a deflectable blade seal.

In another feature of this aspect, the vertical support bracket may include one or more horizontal slots to facilitate lateral adjustment thereof.

Broadly defined, the present invention according to a seventeenth aspect includes a hot/cold aisle air containment system, including a header panel assembly adjustable in each of a horizontal and vertical direction, substantially as shown and described.

Broadly defined, the present invention according to an eighteenth aspect includes a header panel assembly, adjustable in each of a horizontal and vertical direction, substantially as shown and described.

Broadly defined, the present invention according to a nineteenth aspect includes a method of adjusting a header panel assembly substantially as shown and described.

Broadly defined, the present invention according to a twentieth aspect includes a hot/cold aisle air containment system that includes a frame structure, at least one electronic equipment enclosure installed at least partially within the frame structure, and a header panel assembly. The frame structure is adapted to be at least partially covered by one or more panels to define an interior space. The header panel assembly is installed between a top of the at least one electronic equipment enclosure and a horizontal member of the frame structure to prevent circulation of air above the enclosure, and the header panel assembly is adjustable in each of a horizontal and vertical direction.

In features of this aspect, the header panel assembly may include a pair of fixed brackets independently mounted to the horizontal member; each of the pair of fixed brackets may be adjustable along the horizontal member; the header panel assembly may include a main panel and a secondary panel, telescopically engaged with one another, to facilitate adjustment of the width of the header panel assembly; the main panel and the secondary panel may be adjustably coupled to the fixed brackets to facilitate adjustment of the height of the header panel assembly; and/or the header panel assembly may further include at least one clamp for retaining the main panel and the secondary panel against the fixed brackets.

In further features of this aspect, the header panel assembly may include at least one seal disposed at an edge thereof; the at least one seal may be disposed along a side edge of the header panel assembly and may be compressed against an adjacent structure; and/or the air containment system may further include a seal attached along an edge of the horizontal member and positioned to engage a panel of the header panel assembly.

Broadly defined, the present invention according to a twenty-first aspect includes a header panel assembly, for use in a hot/cold aisle air containment system. The header panel assembly includes a pair of fixed brackets independently mountable to a frame structure; a main panel and a secondary panel, telescopically engaged with one another, and at least one clamp for retaining the main panel and the secondary panel against the fixed brackets.

In features of this aspect, the header panel assembly may further include at least one seal disposed along an edge of either the main panel or the secondary panel, the at least one seal being adapted to be compressed against an adjacent structure; telescopic adjustment of the secondary panel relative to the main panel may facilitate a width adjustment; and/or vertical adjustment of the main and secondary panel relative to the fixed brackets may facilitate a height adjustment.

Broadly defined, the present invention according to a twenty-second aspect includes a hot/cold aisle air containment system. The air containment system includes a frame structure, at least one electronic equipment enclosure, and a header panel assembly installed between a top of the at least one electronic equipment enclosure and a horizontal member of the frame structure to prevent circulation of air above the enclosure. The header panel assembly is adjustable in each of a horizontal and vertical direction.

Broadly defined, the present invention according to a twenty-third aspect includes a hot/cold aisle air containment system. The air containment system includes a frame structure, at least one electronic equipment enclosure installed at least partially within the frame structure, and a header panel assembly. The frame structure is adapted to be at least partially covered by one or more panels to define an interior space and includes at least one horizontal member. The header panel assembly is installed between a top of the at least one electronic equipment enclosure and the at least one horizontal member of the frame structure to prevent circulation of air above the enclosure. The header panel assembly includes a pair of panels. A first of the pair of panels is adjustable horizontally relative to a second of the pair of panels, and the pair of panels, together, is adjustable vertically relative to the least one horizontal member.

In features of this aspect, the hot/cold aisle air containment system may further include a pair of fixed brackets independently mounted to the at least one horizontal member, the pair of panels being adjustably coupled to the pair of fixed brackets; the pair of panels, together, may be adjustable vertically relative to the pair of fixed brackets; the header panel assembly may further include a first clamp, for retaining the first panel against a first of the pair of fixed brackets, and a second clamp, for retaining the second panel against a second of the pair of fixed brackets; each of the pair of fixed brackets may be adapted to be mounted to the at least one horizontal member at different mounting locations; and/or each fixed bracket may be mounted to the at least one horizontal member with a separate mounting bracket.

In further features of this aspect, the first panel may be adjustable horizontally, in a telescoping manner, relative to the second panel; and/or the first panel may include at least one horizontally-oriented slotted opening adapted to slidably accommodate a fastener on the second panel.

In still further features of this aspect, the header panel assembly may further include at least one seal adapted to be compressed against an adjacent structure; the at least one seal may be disposed at a side edge of at least one of the pair of panels; the adjacent structure may be a side retention flange of a fixed bracket mounted to the at least one horizontal member; the adjacent structure may be another seal disposed at a side edge of a panel of an adjoining header panel assembly; the at least one seal may be disposed at bottom edges of each of the pair of panels; and/or the at least one seal may be an EPDM rubber seal.

In still another feature of this aspect, the air containment system may further include a seal attached along an edge of the at least one horizontal member and positioned to engage at least one of the pair of panels of the header panel assembly.

Broadly defined, the present invention according to a twenty-fourth aspect includes a hot/cold aisle air containment system. The air containment system includes a frame structure, at least one electronic equipment enclosure installed at least partially within the frame structure, a header panel assembly, and a pair of fixed brackets. The frame structure is adapted to be at least partially covered by one or more panels to define an interior space and includes at least one horizontal member. The header panel assembly is installed between a top of the at least one electronic equipment enclosure and the at least one horizontal member of the frame structure to prevent circulation of air above the enclosure. The pair of fixed brackets are independently mounted to the at least one horizontal member. The header panel assembly includes a pair of panels. A first of the pair of panels is adjustable horizontally, in a telescoping manner, relative to a second of the pair of panels, and the pair of panels, together, is adjustable vertically relative to the pair of fixed brackets.

In features of this aspect, the header panel assembly may further include a first clamp, for retaining the first panel against a first of the pair of fixed brackets, and a second clamp, for retaining the second panel against a second of the pair of fixed brackets; and/or the header panel assembly may further include at least one seal adapted to be compressed against an adjacent structure.

Broadly defined, the present invention according to a twenty-fifth aspect includes a header panel assembly for use in blocking an opening above an electronic equipment enclosure in a hot/cold aisle air containment system. The header panel assembly includes a pair of fixed brackets independently mountable to a horizontal member of a frame structure, first and second panels telescopically engaged with one another, and a pair of clamp fasteners. The first panel is clamped, using a first of the pair of clamp fasteners, against a first of the pair of fixed brackets, and the second panel is clamped, using a second of the pair of clamp fasteners, against a second of the pair of fixed brackets. The first panel is adjustable horizontally, in a telescoping manner, relative to the second panel, and the pair of panels, together, is adjustable vertically relative to the pair of fixed brackets.

In features of this aspect, the first panel may include at least one horizontally-oriented slotted opening adapted to slidably accommodate a fastener on the second panel; and/or the header panel assembly may further include at least one seal disposed along either of a side edge or a bottom edge of at least one of the pair of panels and adapted to be compressed against an adjacent structure.

Broadly defined, the present invention according to a twenty-sixth aspect includes a method of preventing air circulation above an electronic equipment enclosure in a hot/cold aisle air containment system. The method includes providing a frame structure adapted to be at least partially covered by one or more panels to define an interior space, the frame structure including at least one horizontal member; installing at least one electronic equipment enclosure at least partially within the frame structure such that an opening exists between a top of the at least one electronic equipment enclosure and the at least one horizontal member; installing a header panel assembly between a top of the at least one electronic equipment enclosure and the at least one horizontal member of the frame structure, the header panel assembly including a pair of panels engaged with one another; adjusting a first of the pair of panels in a horizontal direction relative to a second of the pair of panels to substantially cover a width dimension of the opening; and adjusting the pair of panels, together, in a vertical direction relative to the at least one horizontal member to substantially cover a height dimension of the opening.

In features of this aspect, the first panel may be telescopically engaged with the second panel; adjusting in the horizontal direction may include loosening at least one fastener attaching the first panel to the second panel, moving the first panel relative to the second panel, and tightening the at least one fastener; and/or the at least one fastener may be attached to the second panel and extend through a horizontally-oriented slotted opening in the first panel, the at least one fastener being permitted to move within the slotted opening when loosened.

In further features of this aspect, installing the header panel assembly may include mounting a pair of fixed brackets, each with a clamp fastener, to the at least one horizontal member, and clamping the pair of panels to the pair of fixed brackets using the clamp fasteners; adjusting in the vertical direction may include loosening the clamp fasteners, moving the pair of panels upward or downward relative to the pair of fixed brackets mounted to the at least one horizontal member, and tightening the clamp fasteners; and the method may further include removing at least one of the pair of fixed brackets, and/or re-mounting the removed fixed bracket to the at least one horizontal member at a different mounting location.

In still further features of this aspect, the method may further include attaching at least one seal to either a side edge or a bottom edge of at least one of the pair of panels, and arranging the at least one seal to engage and be compressed against an adjacent structure; and/or the method may further include attaching a seal along an edge of the at least one horizontal member, and arranging the at least one seal to engage and be compressed against at least one of the pair of panels.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
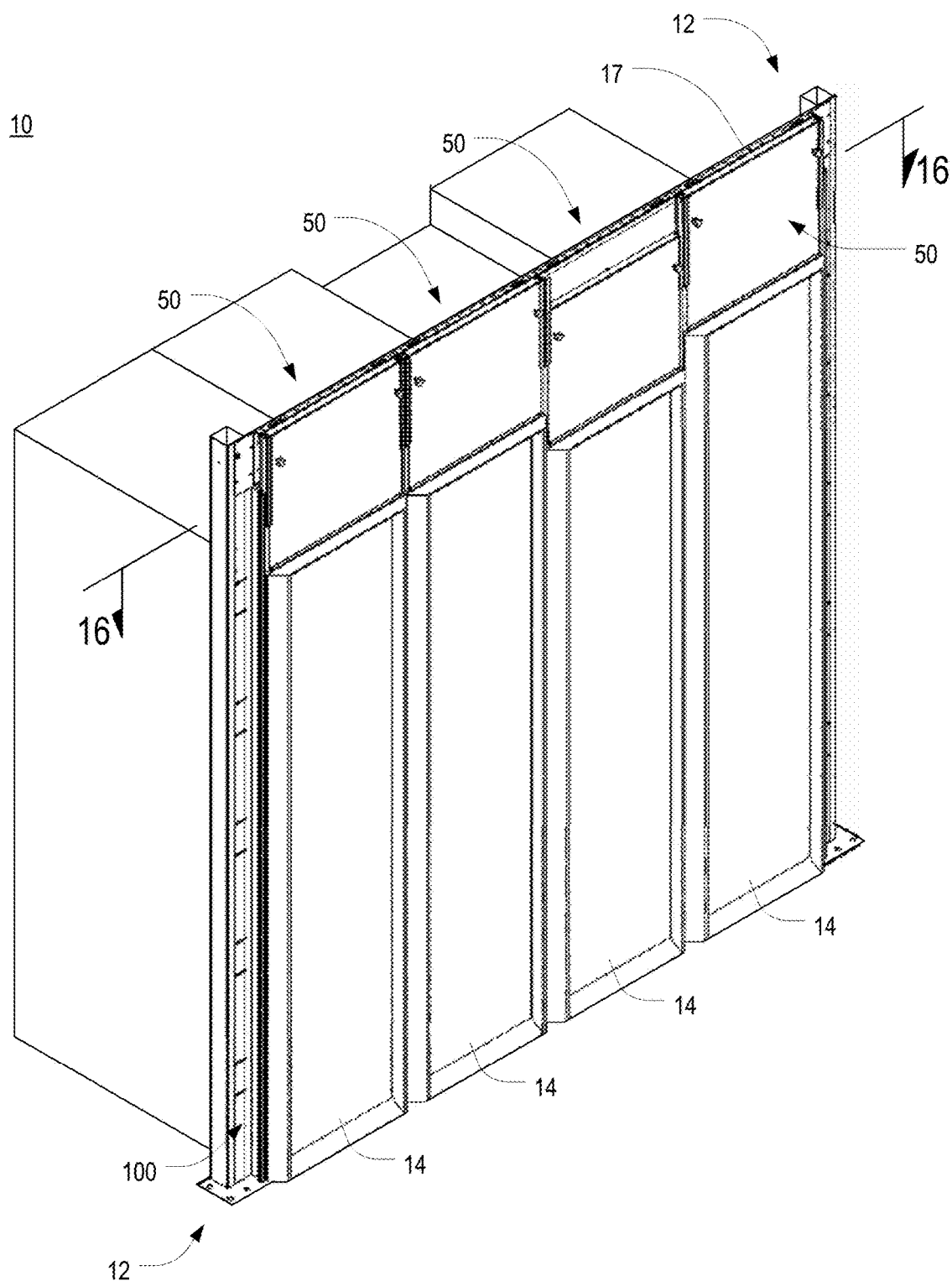
FIG. 1 is an isometric view of a hot/cold aisle air containment system in use with a row of electronic equipment enclosures in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. § 112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

FIG. 1 is an isometric view of a hot/cold aisle air containment system 10 in use with a row of electronic equipment enclosures 14 in accordance with one or more preferred embodiments of the present invention. As shown therein, the containment system 10 includes a frame structure 12, a plurality of header panel assemblies 50 and a pair of side seal assemblies 100. Each of these will be discussed in greater detail hereinbelow. Enclosures suitable for use with preferred embodiments of the present invention are described and illustrated in commonly-assigned U.S. Pat. Nos. 5,997,117; 6,185,098; 7,697,285; 7,804,685; U.S. Patent Application Publication No. US 2009/0227197 A1; and U.S. Patent Application Publication No. US 2010/0172092 A1, the entirety of each of which is incorporated herein by reference.

Figure 2:
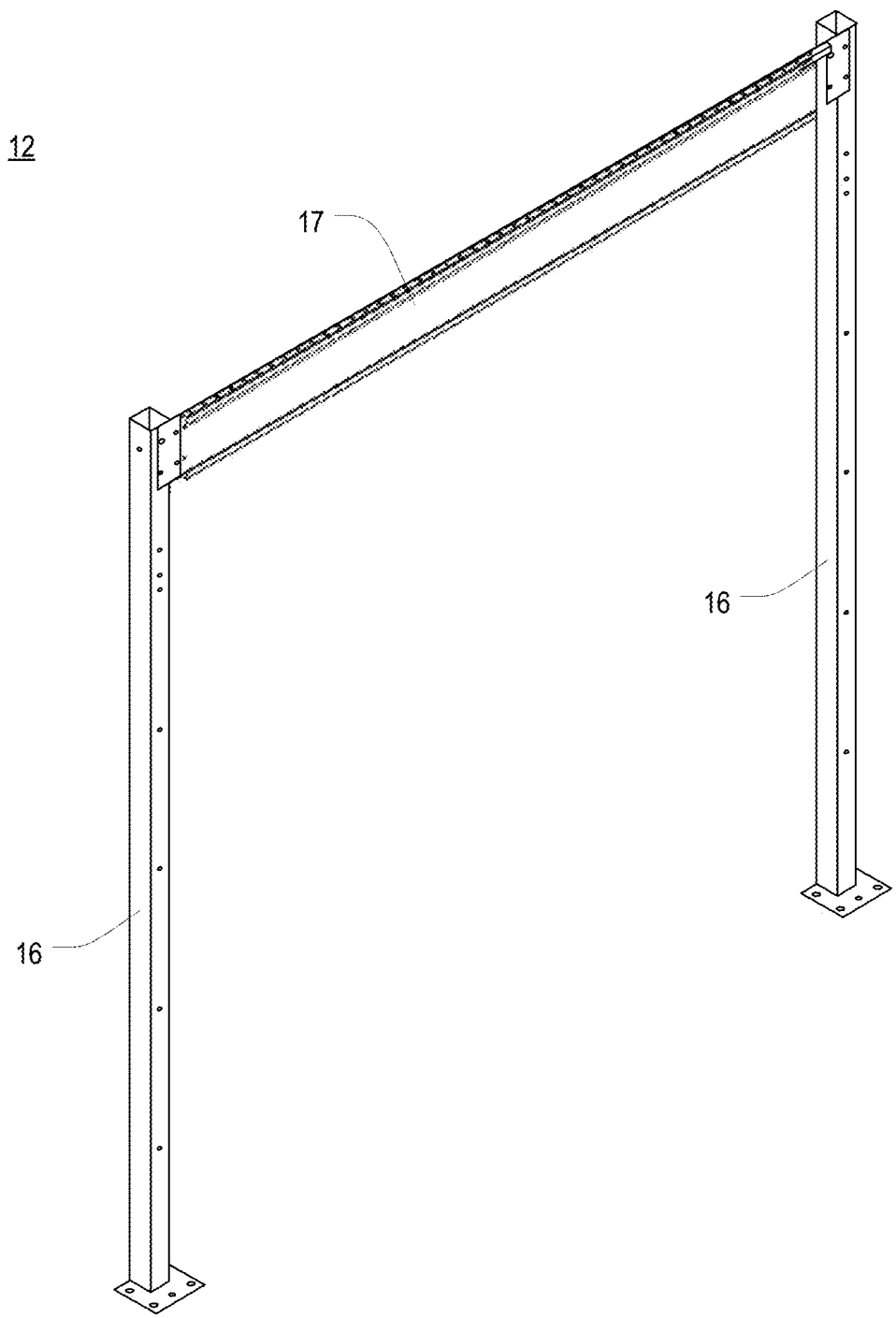
FIG. 2 is an isometric view of the frame structure of FIG. 1.

FIG. 2 is an isometric view of the frame structure 12 of FIG. 1. As shown therein, the frame structure 12 includes a pair of vertical posts 16 and a horizontal beam 17.

Figure 3:
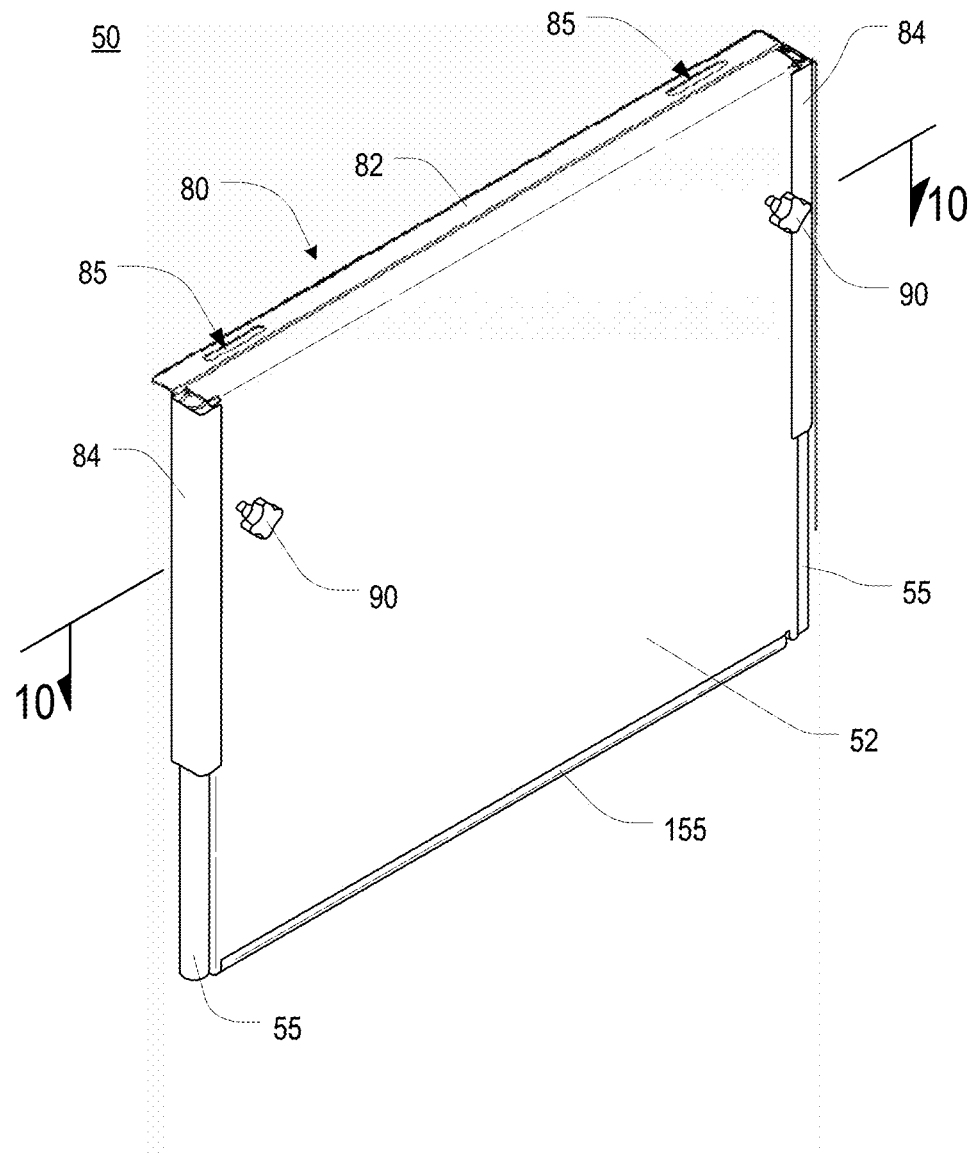
FIG. 3 is an isometric view of one of the header panel assemblies of FIG. 1.
Figure 4:
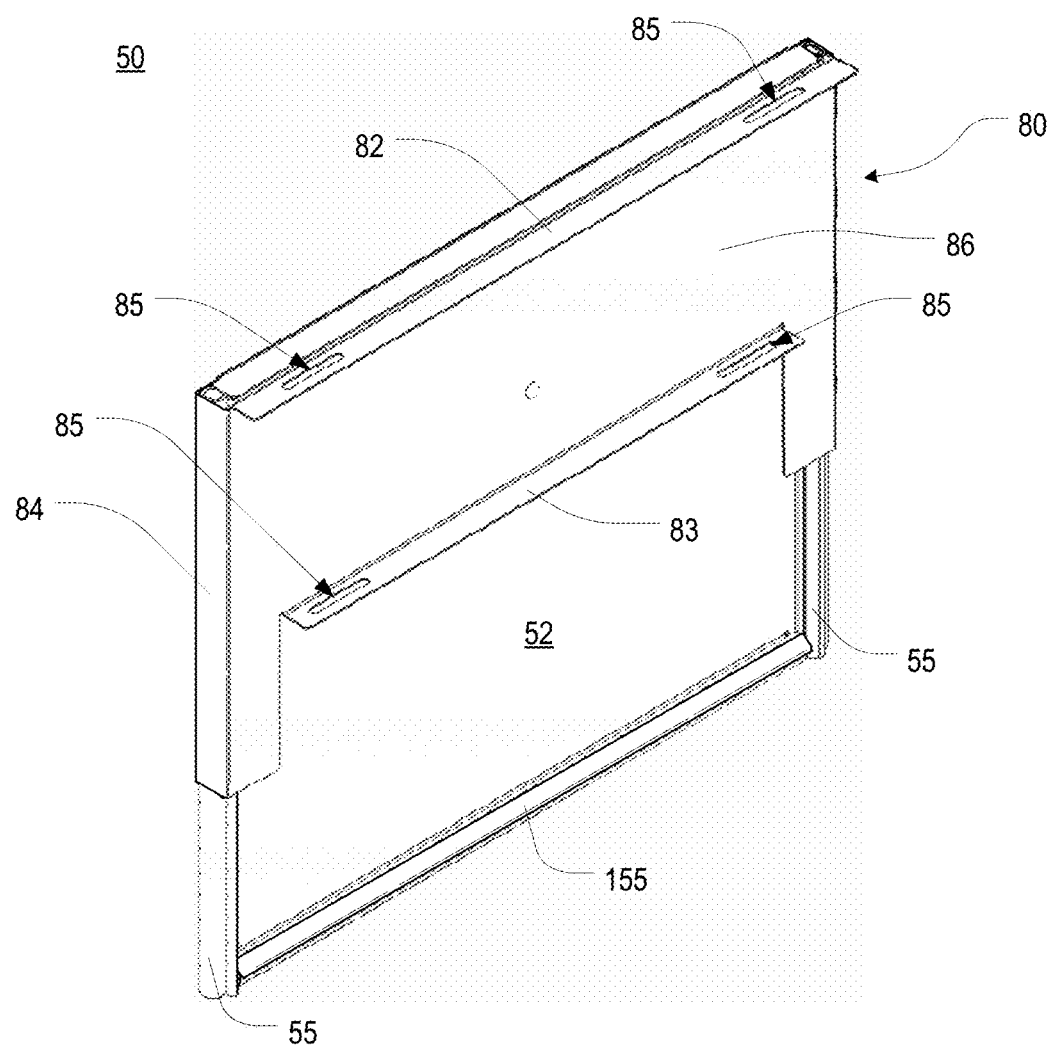
FIG. 4 is a reverse isometric view of the header panel assembly of FIG. 3.
Figure 5:
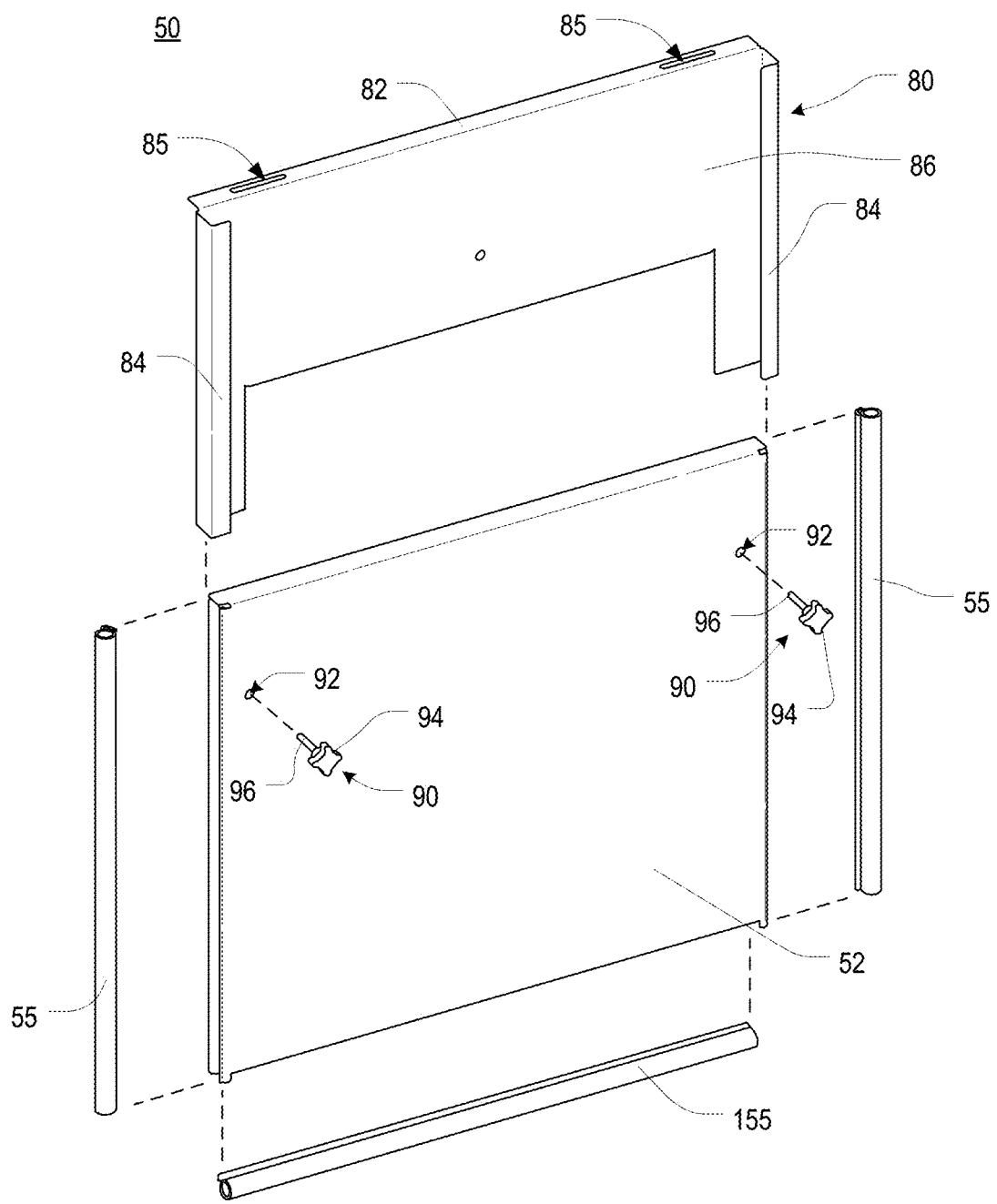
FIG. 5 is an orthogonal exploded view of the header panel assembly of FIG. 3.

FIG. 3 is an isometric view of one of the header panel assemblies 50 of FIG. 1; FIG. 4 is a reverse isometric view of the header panel assembly 50 of FIG. 3; and FIG. 5 is an orthogonal exploded view of the header panel assembly 50 of FIG. 3. As shown therein, each header panel assembly 50 includes a main panel 52, a fixed bracket 80, a pair of clamps 90, and a plurality of seals 55, 155. As perhaps best shown in FIGS. 4 and 5, the fixed bracket 80 includes a top mounting flange 82, a bottom mounting flange 83 and two side retention flanges 84, all extending from a main body 86. The top and bottom mounting flanges 82, 83 facilitate attachment of the fixed bracket 80 to the horizontal beam 17 of the frame structure 12. For instance, it is contemplated that the fixed bracket 80 can be attached to the horizontal beam 17 with fasteners (not illustrated) adapted to fit through or clamp around slots 85 of the mounting flanges 82,83. The header panel assembly 50 can be adjusted laterally (i.e., a side-to-side direction) along the beam 17 by adjusting the position of the fasteners within the corresponding slots 85. The side retention flanges 84 are adapted to receive the main panel 52 as more fully described hereinbelow.

Figure 6:
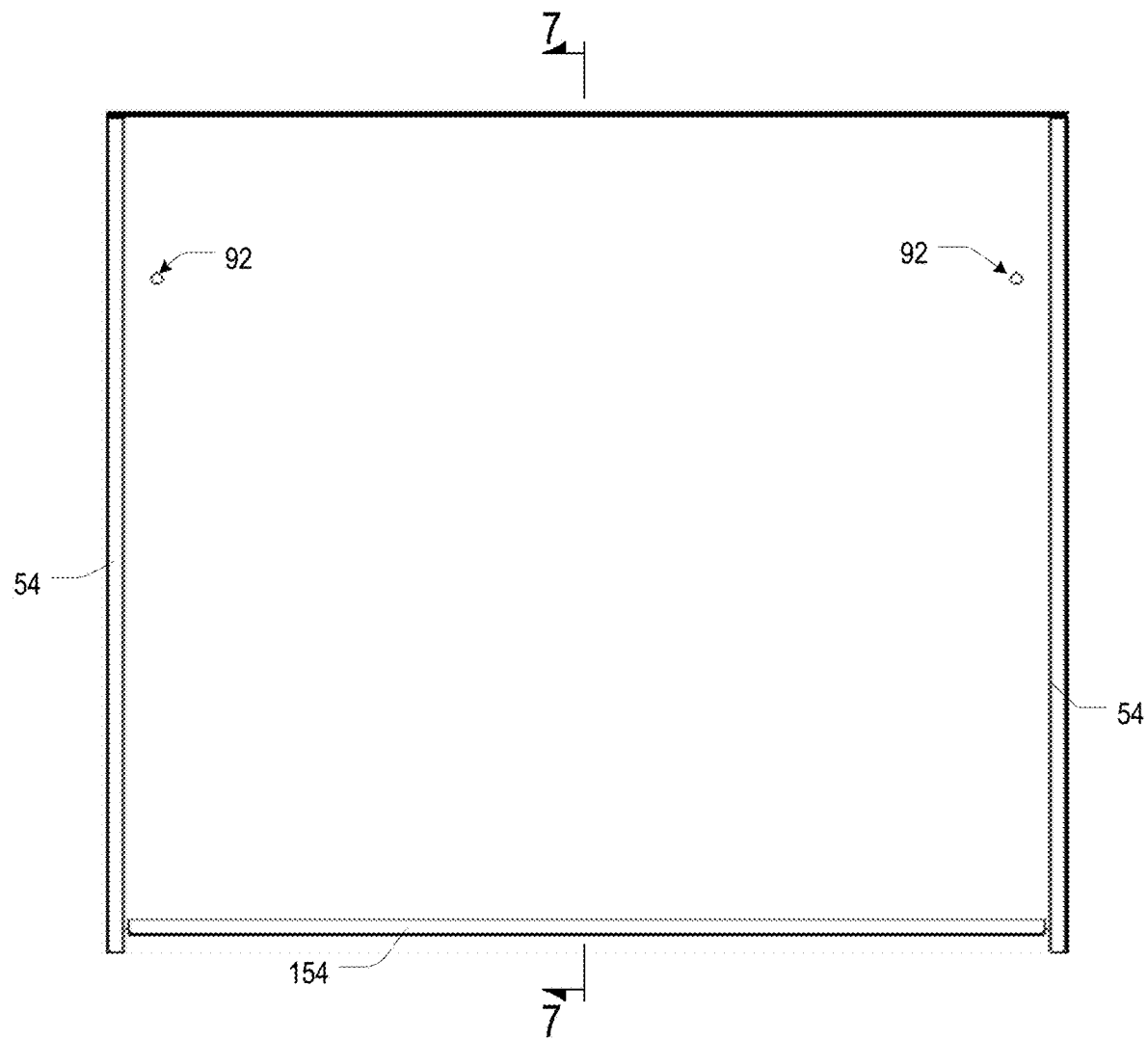
FIG. 6 is a rear plan view of the main header panel of FIG. 3.
Figure 7:
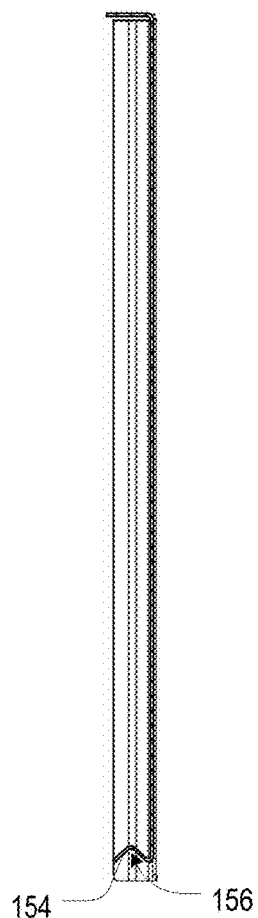
FIG. 7 is an end cross-sectional view of the main panel of FIG. 6, taken along line 7-7.
Figure 8:
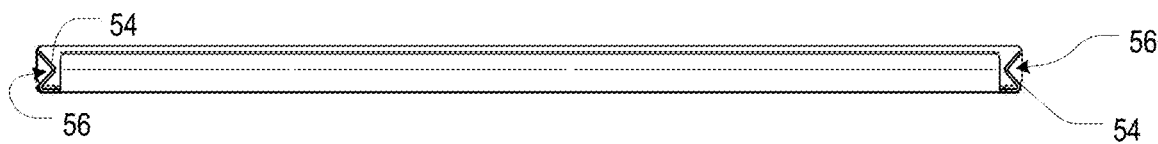
FIG. 8 is a bottom view of the main panel of FIG. 6.
Figure 9:
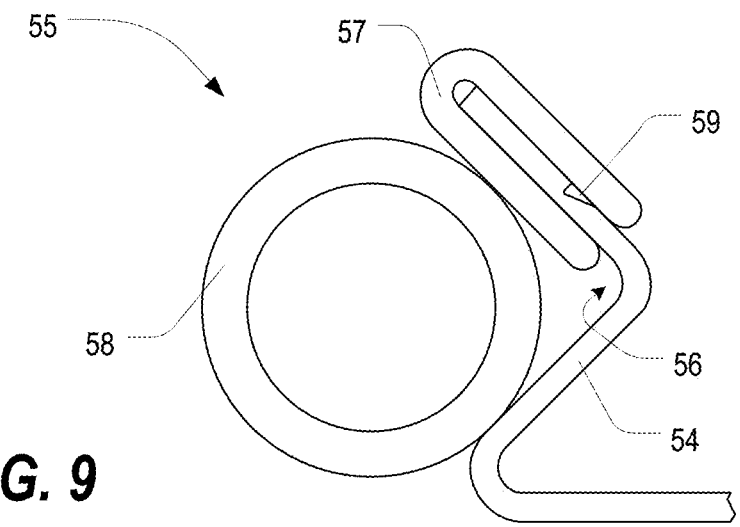
FIG. 9 is a schematic view of a seal mounted in one of the V-shaped grooves of the main header panel of FIG. 6.

FIG. 6 is a rear plan view of the main header panel 52 of FIG. 3, while FIG. 7 is an end cross-sectional view of the main panel 52 of FIG. 6, taken along line 7-7, and FIG. 8 is a bottom view of the main panel 52 of FIG. 6. As shown therein, the main panel 52 includes V-shaped flanges 54,154 along the sides and bottom thereof. Each V-shaped flange 54,154 defines a groove 56,156 of corresponding shape. These grooves 56,156 are adapted to receive and retain a respective seal 55,155. In this regard, FIG. 9 is a schematic view of a seal 55 mounted in one of the V-shaped grooves 56 of the main header panel 52 of FIG. 6. It will be appreciated that the seals 55,155 may have any of a wide range of different shapes and configurations and may be comprised of any of a wide range of different materials. In contemplated embodiments, the seal may be a gasket, a brush, a wiper blade, or a compressible bumper. As seen in cross-section, each seal 55,155 includes a mounting portion 57 and a body portion 58, wherein the mounting portion 57 is adapted to attach to the edge of the V-shaped flanges 54,154. A boss 59 may be provided on the mounting portion 57 to assist in attaching the mounting portion 57 snugly around the edge of the V-shaped flange 54,154. The body portion 58 is large enough to extend well outside of the V-shaped groove 56,156 and is comprised of a compressible material of any type conventionally utilized for gaskets, seals, brushes or the like.

Figure 10:
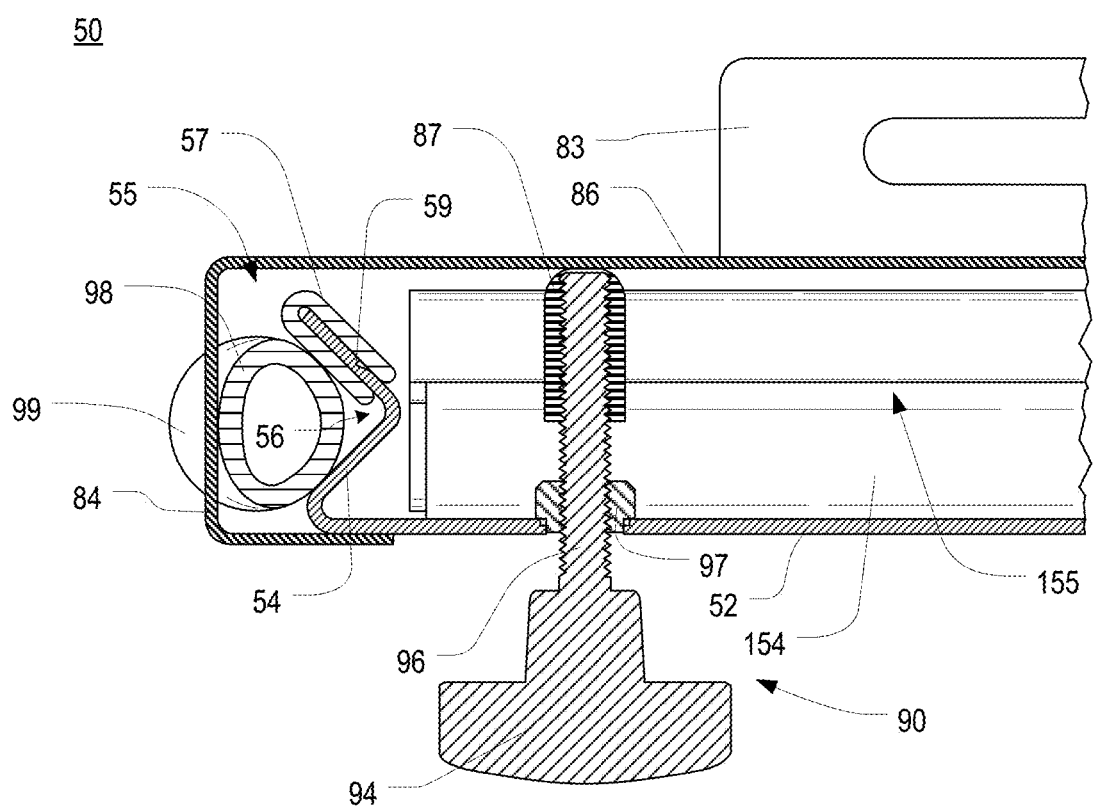
FIG. 10 is a fragmentary top cross-sectional view of the left edge of the header panel assembly of FIG. 3, taken along line 10-10.

When the main panel 52 is positioned within the side retention flanges 84 of the fixed bracket 80, the side seals 55 are partially trapped within the side V-shaped flanges 54 by the retention flanges 84. This is illustrated in FIG. 10, which is a fragmentary top cross-sectional view of the left edge of the header panel assembly 50 of FIG. 3, taken along line 10-10. As shown therein, the upper end 98 of the seal 55 is compressed into the V-shaped groove 56 by the retention flange 84, while the lower end 99 of the seal 55 remains uncompressed. It will be appreciated, however, that when the header panel assembly 50 is properly installed in place next to another header panel assembly 50, a side seal assembly or another structure, the lower end 99 of the seal 55 will usually be compressed as well, thereby sealing the header panel assembly 50 against the respective structure.

Referring again to FIG. 6, it will be appreciated that the lower ends of the side flanges 54 extend below the bottom of the main panel 52, and thus below the bottom flange 154. This arrangement permits the bottom seal 155 to be placed within the bottom groove 156 such that it may be generally aligned with the lower end of the side flanges 54, thereby helping to ensure a complete seal across the bottom of the assembly 50. This is at least partially illustrated in FIG. 3.

With particular reference to FIGS. 3, 5 and 10, it will be appreciated that the body of the main panel 52 is penetrated by two clamp apertures 92 adapted to receive the clamps 90. In at least some embodiments, the clamps 90 each include a handle 94 and a threaded shaft 96, and a threaded nut 97 is attached behind and around each aperture 92. In other embodiments, the apertures 92 may themselves be threaded, or may comprise sheet metal or the like into which threads may be created by screwing the threaded clamp shaft 96 therethrough. As will be appreciated, the main header panel 52 may be held in place against the fixed bracket 80 by screwing the clamp shafts 96 through the apertures 92 in the panel 52 until the ends of the shafts 96 are forced against the main body 86 of the fixed bracket 80. In order to preserve structural integrity of the main body 86 of the fixed bracket 80, the end of the shafts 96 may be fitted with protective end caps 87. While clamps 90 are shown in the drawings, it is contemplated that a wide range of mechanisms may be used to hold the main panel 52 in place against the fixed bracket 80. In particular, it is contemplated that cam locks, spring fasteners or any of a range of other mechanisms may be implemented to accomplish the clamping function.

Use of the header panel assembly 50 may perhaps be best understood with reference to FIGS. 1 and 10. Each header panel assembly 50 may be installed directly above a respective electronic equipment enclosure 14 to fill the space between the top of the enclosure 14 and the frame structure 12 or other structure above it. The vertical dimension of each header panel assembly 50 may be adjusted by loosening the clamps 90 and sliding the main header panel 52 up or down relative to the fixed bracket 80 before retightening the clamps 90. The clamp arrangement permits infinite adjustment of the vertical position of the main header panel 52 relative to its fixed bracket 80 (within a range determined by the overall dimensions of the panel 52 and bracket 80), and thus allows the header panel assembly 50 to be custom adjusted to fit the space between the top of the respective enclosure 14 and the frame structure 12. When installed above the enclosure 14, the header panel assembly 50 blocks the space above the enclosure 14 and prevents recirculation of heated air from the rear of the enclosure 14 over the top thereof, where it could mingle with the cooling air being provided to the enclosure front. (Alternatively, the header panel assembly 50 prevents recirculation of heated air from the front of the enclosure 14 over the top thereof, where it could mingle with the cooling air being provided to the enclosure rear.)

The infinite adjustability (within the dimensional range) ensures that air gaps may be substantially entirely eliminated, and differences in enclosure heights managed effectively. This is illustrated, for example, in FIG. 1, where three enclosures 14 have the same approximate height, while a fourth (the second from the right), is shorter than the other three. The header panel assemblies 50 for the first three are all adjusted to be the same length, while the header panel assembly 50 for the fourth enclosure 14 is lengthened to ensure that the bottom of the main panel 52 extends to the top of the enclosure 14 with the bottom seal 155 being compressed between the bottom V-shaped flange 154 and the top of the enclosure 14.

Figure 11:
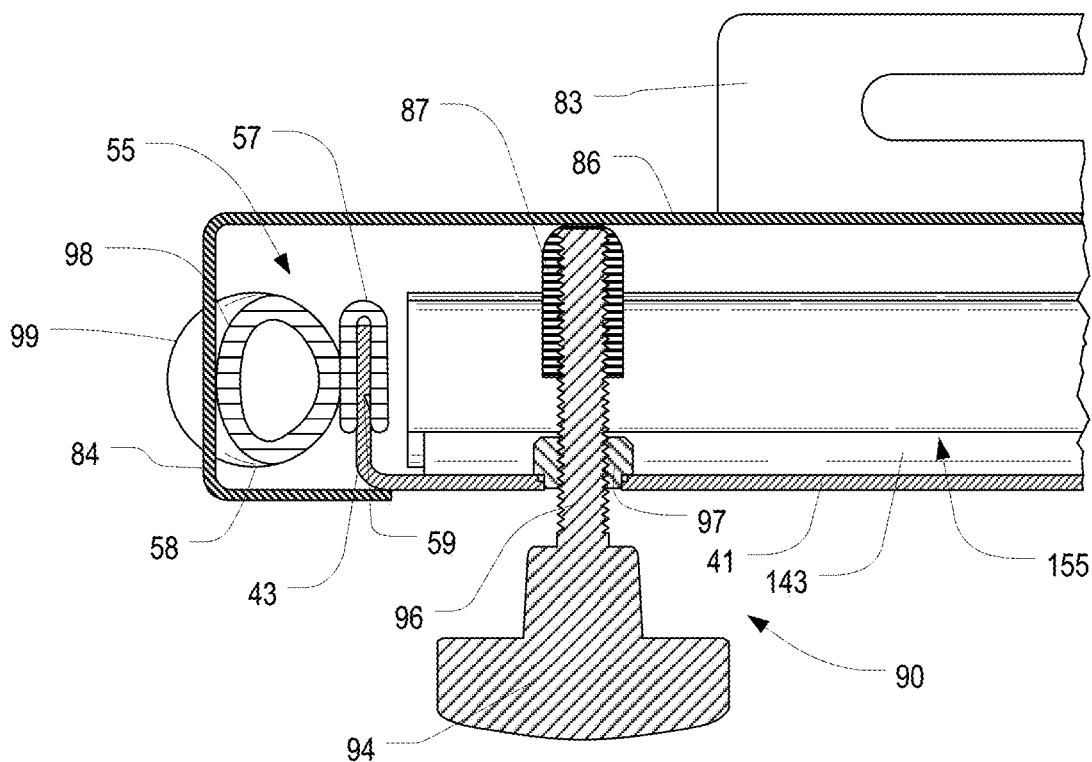
FIGS. 11-13 are fragmentary top cross-sectional views, similar to that of FIG. 10, of the left edge of various alternative header panel assembly embodiments.
Figure 12:
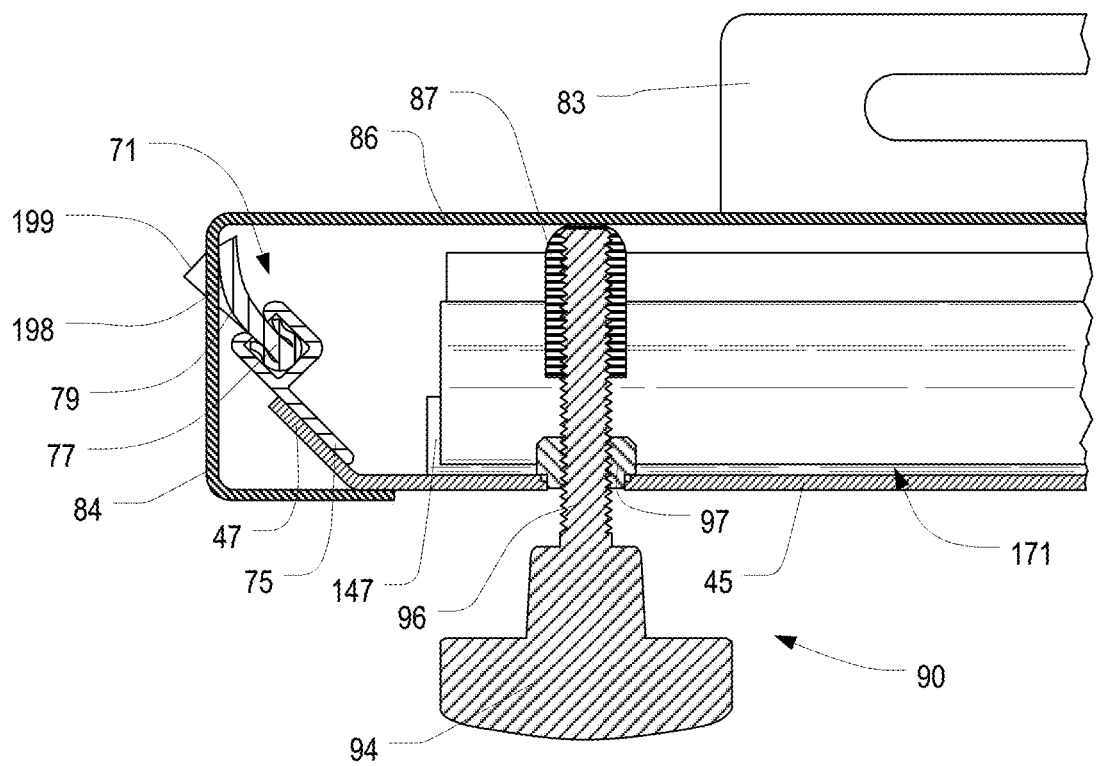
Figure 13:
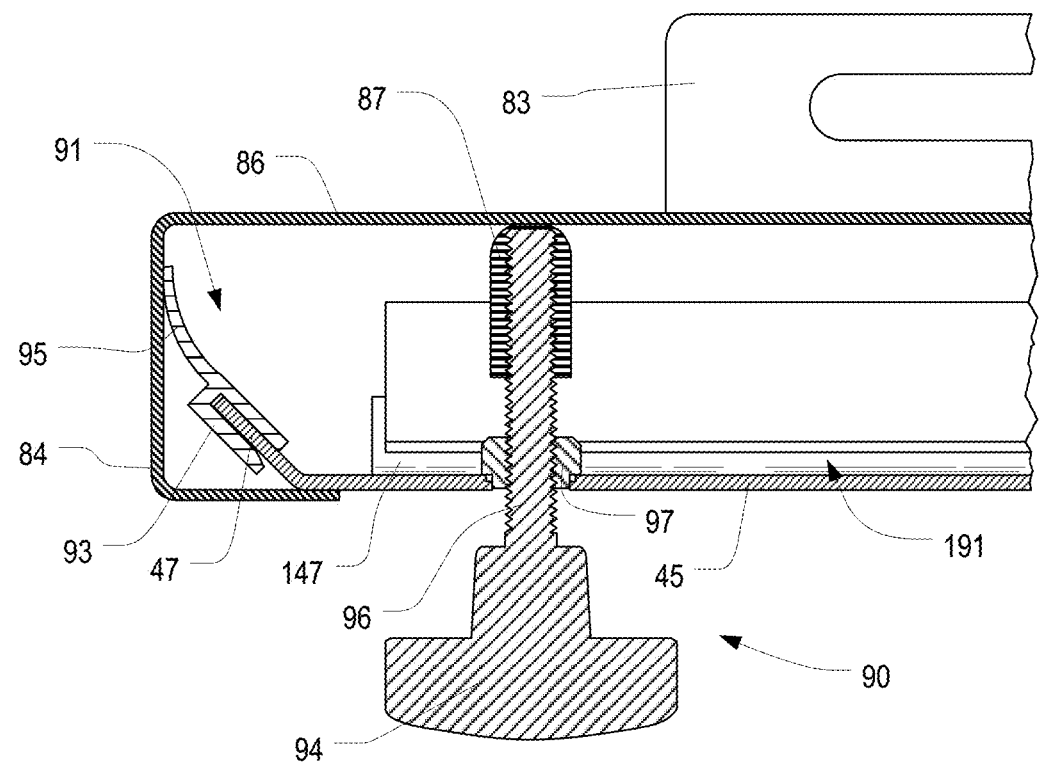

FIGS. 11-13 are fragmentary top cross-sectional views, similar to that of FIG. 10, of the left edge of various alternative embodiments of header panel assemblies. As shown in FIGS. 11-13, flanges on the main panel may have any of a variety of different shapes and configurations. For instance, in FIG. 11, rather than V-shaped flanges, a main panel 41 of a header panel assembly 150 includes generally perpendicular flanges 43,143 along the sides and bottom thereof. Each perpendicular flange 43,143 defines an outer edge to accommodate and retain a respective seal 55,155. As in the embodiment depicted in FIG. 10, each seal 55,155 includes a mounting portion 57 adapted to attach to the edge of the perpendicular flange 43,143. A boss 59 may be provided on the mounting portion 57 to assist in attaching the mounting portion 57 snugly around the edge of the perpendicular flange 43,143. Each seal 55,155 further includes a body portion 58 comprised of a compressible material of any type conventionally utilized for gaskets, seals, brushes or the like. When the main panel 41 is positioned within the side retention flanges 84 of the fixed bracket 80, the seals 55,155 extend from the edges of the main panel 41 and are in a position to abut an adjacent structure, thereby forming a seal therewith. As shown therein, the upper end 98 of the seal 55 is compressed into the V-shaped groove 56 by the retention flange 84, while the lower end 99 of the seal 55 remains uncompressed. It will be appreciated, however, that when the header panel assembly 150 is properly installed in place next to another header panel assembly 150, a side seal assembly or another structure, the lower end 99 of the seal 55 will usually be compressed as well, thereby sealing the header panel assembly 150 against the respective structure.

In FIG. 12, a main panel 45 of a header panel assembly 250 includes flanges 47,147 at the sides and bottom thereof that extend away from the main panel 45 at an angle. Each angled flange 47,147 defines an outer edge to which a respective brush seal 71,171 is attached. Each brush seal 71,171 includes a cradle portion 75 that attaches along the outer edge of the angled flanges 47,147 and a brush portion 77 that is adapted to be snap-fit into the cradle portion 75. Bristles 79 of the brush portion 77 extend away from the main panel 45 and are in a position to abut an adjacent structure, thereby forming a seal therewith. As shown in FIG. 12, bristles 79 at the upper end 198 of the brush seal 71 are deflected by the retention flange 84 while bristles 79 at the lower end 199 of the brush seal 71 remain undeflected. It will be appreciated, however, that when the header panel assembly 250 is properly installed in place next to another header panel assembly, a side seal assembly or another structure, the lower end 199 of the brush seal 71 will usually be deflected as well, thereby sealing the header panel assembly 250 against the respective structure.

In FIG. 13, the main panel 45 of a header panel assembly 350 includes flanges 47,147 at the sides and bottom thereof that extend away from the main panel 45 at an angle. Each angled flange 47,147 defines an outer edge to which a respective deflectable blade seal 91,191 is attached. Each blade seal 91,191 includes an attachment portion 93 that is adapted to fittingly accommodate an outer edge of a corresponding angled flange 47,147. Each blade seal 91,191 further includes a blade portion 95 that extends away from the main panel 45 and is in a position to abut an adjacent structure so as to form a seal therewith. As shown in FIG. 13, the blade portion 95 is deflected by, and forms a seal against, the retention flange 84. It will also be appreciated that when the header panel assembly 350 is properly installed in place next to another header panel assembly, a side seal assembly or another structure, any portion of the blade seal 91 that extends below the retention flange 84 would likewise be deflected by an adjacent structure and, thus, capable of sealing the header panel assembly 350 against the respective structure.

Figure 14A:
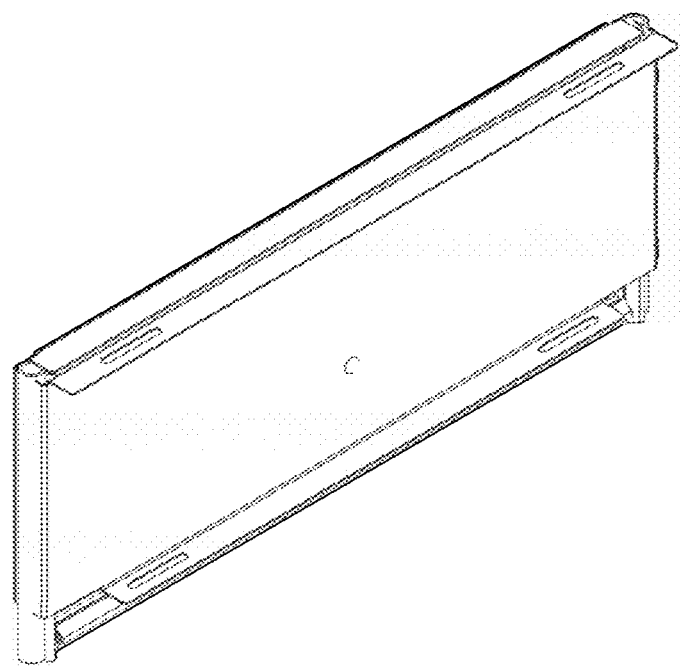
FIGS. 14A-14C are isometric views of header panel assemblies similar to that of FIG. 3 but having different vertical dimensions.
Figure 14B:
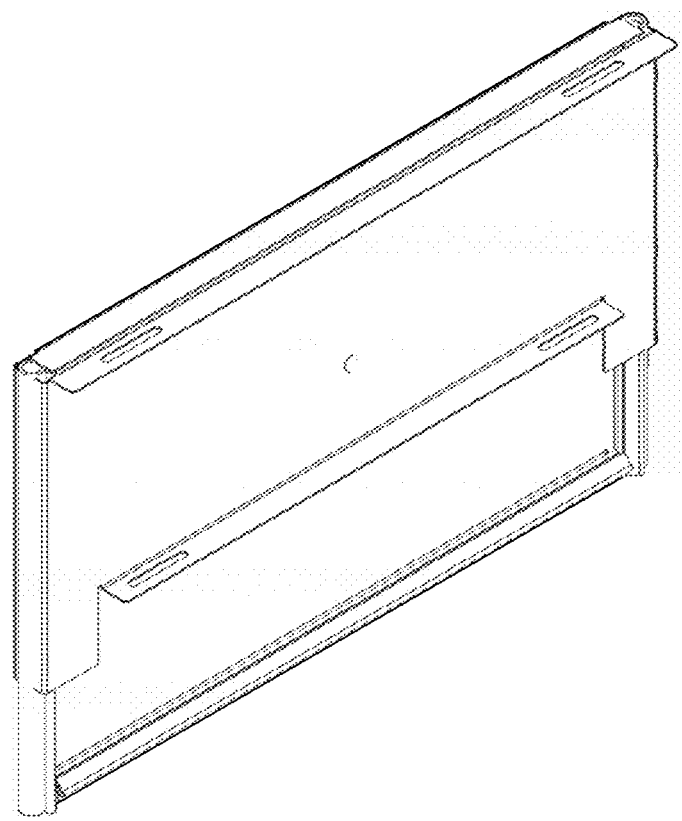
Figure 14C:
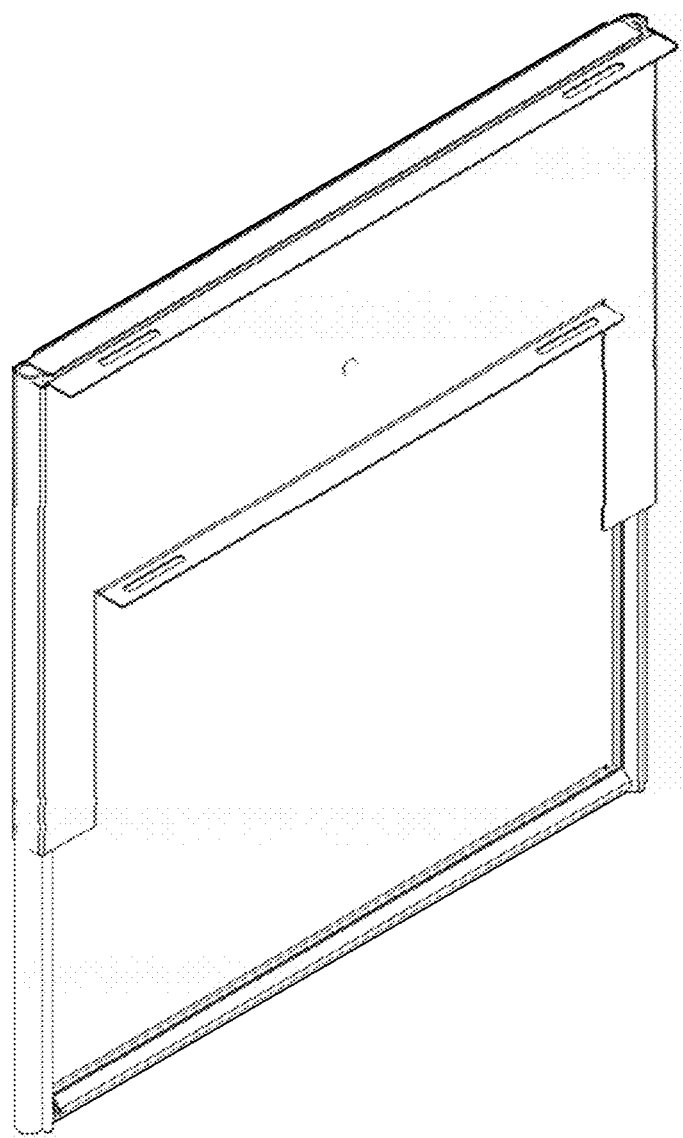

In at least some commercial embodiments, header panel assemblies 50 of different vertical dimensions are provided to accommodate enclosures 14 and frame structures 12 or other structures of different sizes. For example, FIGS. 14A-14C are isometric views of header panel assemblies similar to that of FIG. 3 but having different vertical dimensions. It will also be appreciated that different widths may likewise be provided.

Figure 15:
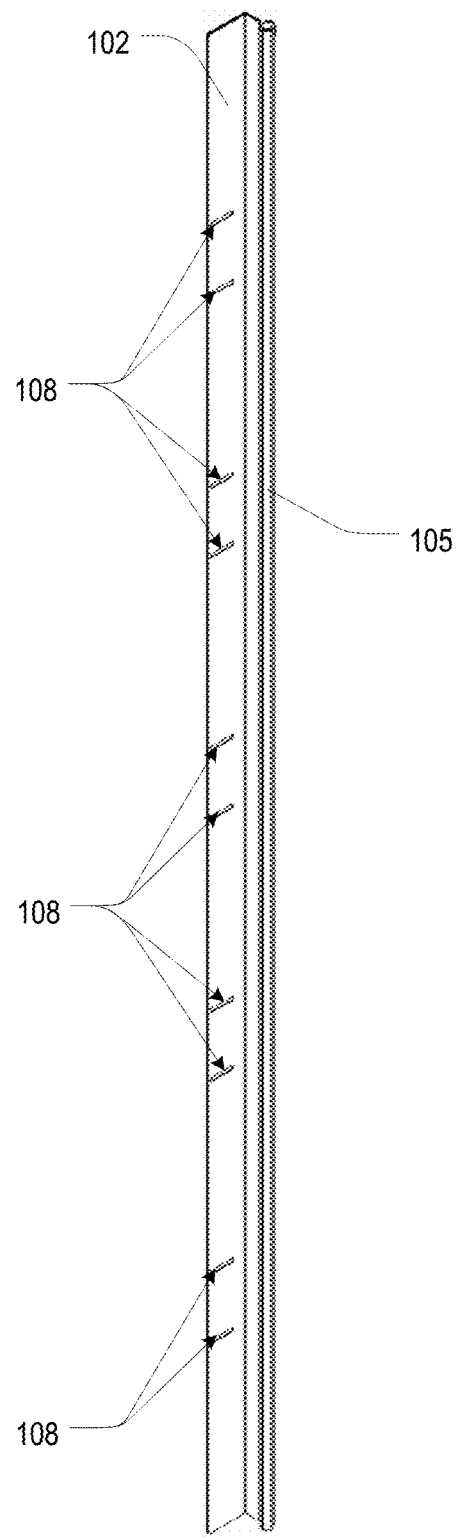
FIG. 15 is an isometric view of one of the side seal assemblies of FIG. 1.

Air sealing along the sides of electronic equipment enclosures 14 at the ends of the row of enclosures 14 may be facilitated by the side seal assemblies 100. FIG. 15 is an isometric view of one of the side seal assemblies 100 of FIG. 1. As shown therein, each side seal assembly 100 includes a vertical support bracket 102 and a seal 105. The vertical support bracket 102 may be attached to a vertical post 16 of the frame structure 12, or to another suitable structure, via fasteners 103 (shown in FIG. 16) that fit through or clamp around one or more of a plurality of horizontal slots 108. The vertical support bracket 102 can be adjusted laterally (i.e., a side-to-side direction) along the width of the vertical post 16 by adjusting the position of the fasteners within the corresponding horizontal slots 108.

Figure 16:
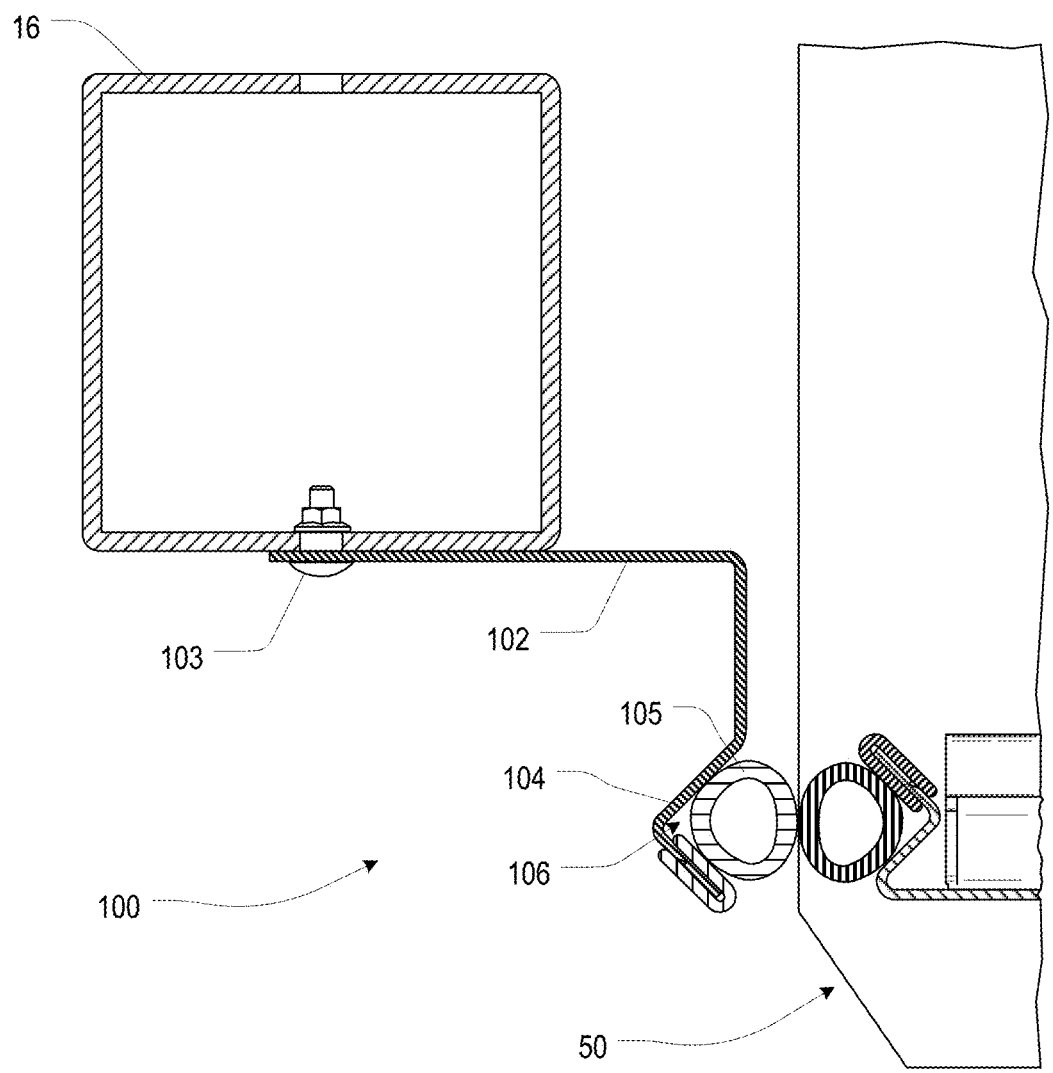
FIG. 16 is a fragmentary top cross-sectional view of the left end of the hot/cold aisle air containment system of FIG. 1, taken along line 16-16, illustrating the interface between a header panel assembly and a side seal assembly.

FIG. 16 is a fragmentary top cross-sectional view of the left end of the hot/cold aisle air containment system 10 of FIG. 1, taken along line 16-16, illustrating the interface between a header panel assembly 50 and a side seal assembly 100. As shown therein, the vertical support bracket 102 includes a V-shaped flange 104, similar in cross-section to the V-shaped flanges 54,154 of the main header panel 52, which defines a groove 106 of corresponding shape. The groove 106 is adapted to receive a seal 105 which is also of similar cross-section and material to the seals 55,155 of the header panel assembly 50. As shown therein, the seal 105 of the side seal assembly 100 is compressed by and against the side seal 55 of the adjacent header panel assembly 50 and also by the body of the electronic equipment enclosure 14 below. In combination with the vertical support bracket 102, the seal 105 of the side seal assembly 100 thus provides top-to-bottom sealing between the vertical post 16 and both the leftmost enclosure 14 of FIG. 1 and the leftmost header panel assembly 50. It will be appreciated that the vertical support bracket 102 may be adjusted laterally, as described previously, to customize the spacing between the V-shaped flange 104 and the enclosure 14/header panel assembly 50. While a compressible seal is depicted in FIGS. 15 and 16, it is contemplated that a wide variety of different seals, including brush seals and deflectable blade seals, may be used in connection with the side seal assembly 100. Furthermore, while the flanges 54,154 are shown as V-shaped, it is contemplated that the flanges 54,154 may have any of a wide variety of different shapes and configurations, including generally perpendicular flanges and angled flanges.

When installed next to an enclosure 14 and the header panel assembly 50 above it, the side seal assembly 100 blocks the space between the enclosure 14 and the vertical post 16 and prevents recirculation of heated air from the rear of the enclosure 14 around the side thereof, where it could mingle with the cooling air being provided to the enclosure front.

Figure 17:
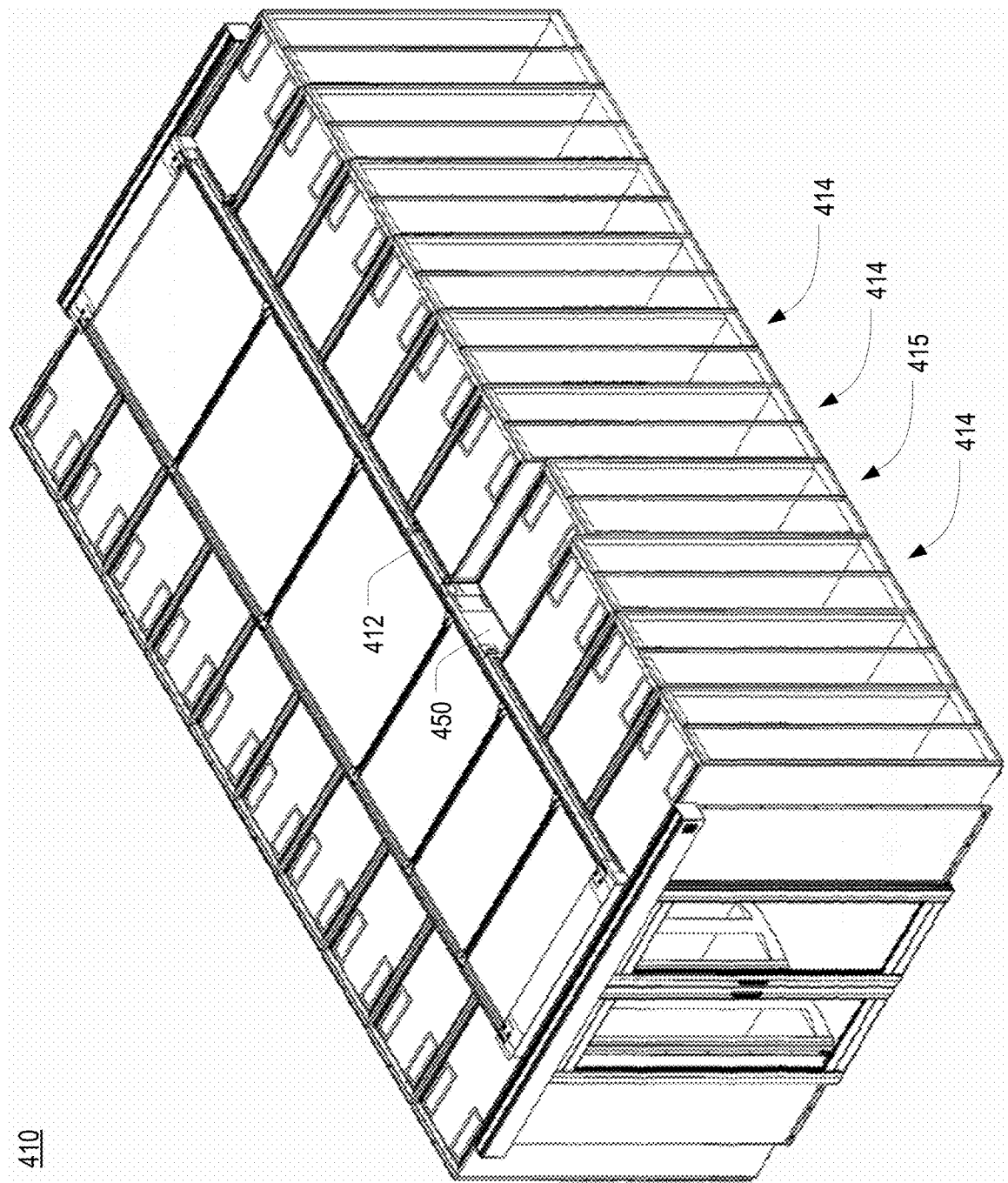
FIG. 17 is an isometric view of a hot/cold aisle air containment system having an alternative header panel assembly in accordance with one or more preferred embodiments of the present invention.

FIG. 17 is an isometric view of a hot/cold aisle air containment system 410 having an alternative header panel assembly 450 in accordance with one or more preferred embodiments of the present invention, and FIGS. 18A-18D are isometric views of the header panel assembly 450 of FIG. 17. With particular reference to FIGS. 18A-18D, the header panel assembly 450 includes a main panel 452, a secondary panel 453, and a pair of fixed brackets 480. The body of the secondary panel 453 includes two slotted openings 457, each adapted to receive a corresponding fastener 443. Each fastener 443, which may be in the form of a screw, bolt or other form of fastener, extends though both the slotted opening 457 of the secondary panel 453 and through the body of the main panel 452. When properly fastened, tightened or otherwise secured, the fasteners 443 effectively attach the panels 452,453 together.

The header panel assembly 450 is adjustable laterally or horizontally (i.e., in a side-to-side direction) so as to be customizable to occupy spaces with varying width requirements, and is therefore not limited to a fixed dimensional width. By adjusting the position of the fasteners 443 within the slotted openings 457, the dimensional width of the header panel assembly 450 can effectively be adjusted to accommodate varying width requirements. To adjust the dimensional width, the fasteners 443 are loosened or unfastened so as to be movable within the horizontal slots 457. Once the secondary panel 453 is adjusted to a desired position, the fasteners 443 may be tightened, clamped or otherwise locked into position in order to at least temporarily fix the dimensional width of the header panel assembly 450. It is contemplated that a wide variety of different fasteners and fastening mechanisms may be utilized in connection with the header panel assembly 450. In one contemplated embodiment, depicted in FIGS. 18A-18D, each fastener 443 is a threaded fastener with a nut 449 used to clamp the fastener 443 into position.

Figure 18A:
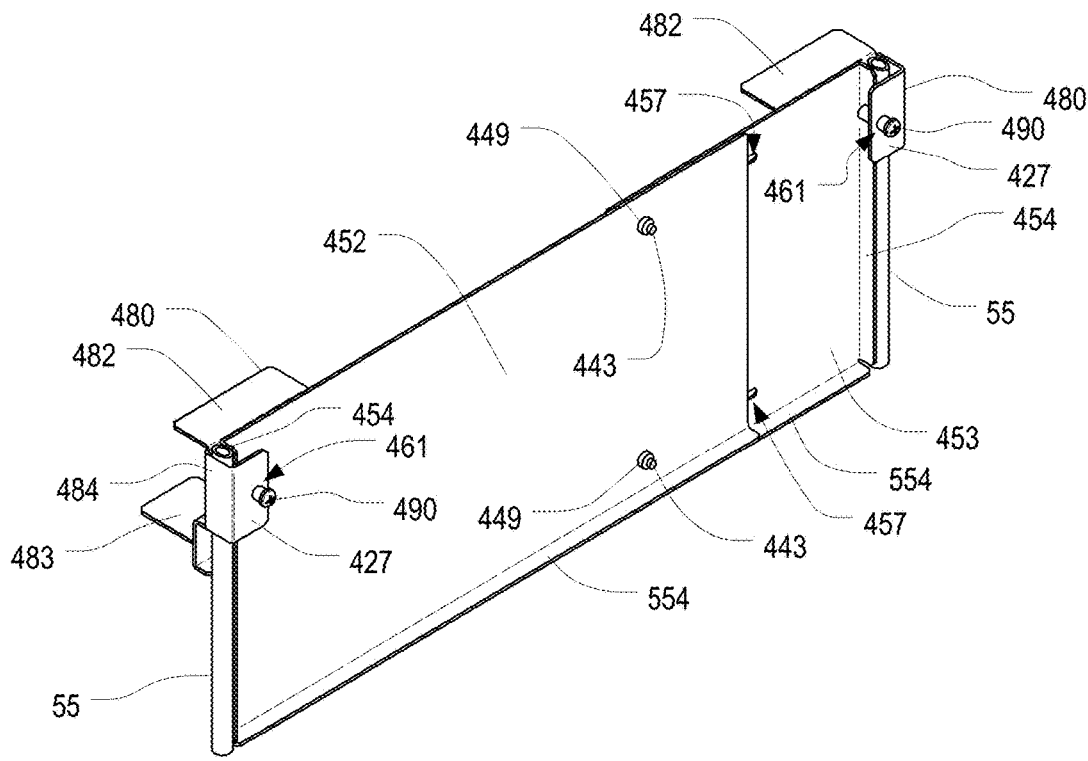
FIGS. 18A-18D are isometric views of the header panel assembly of FIG. 17.
Figure 18B:
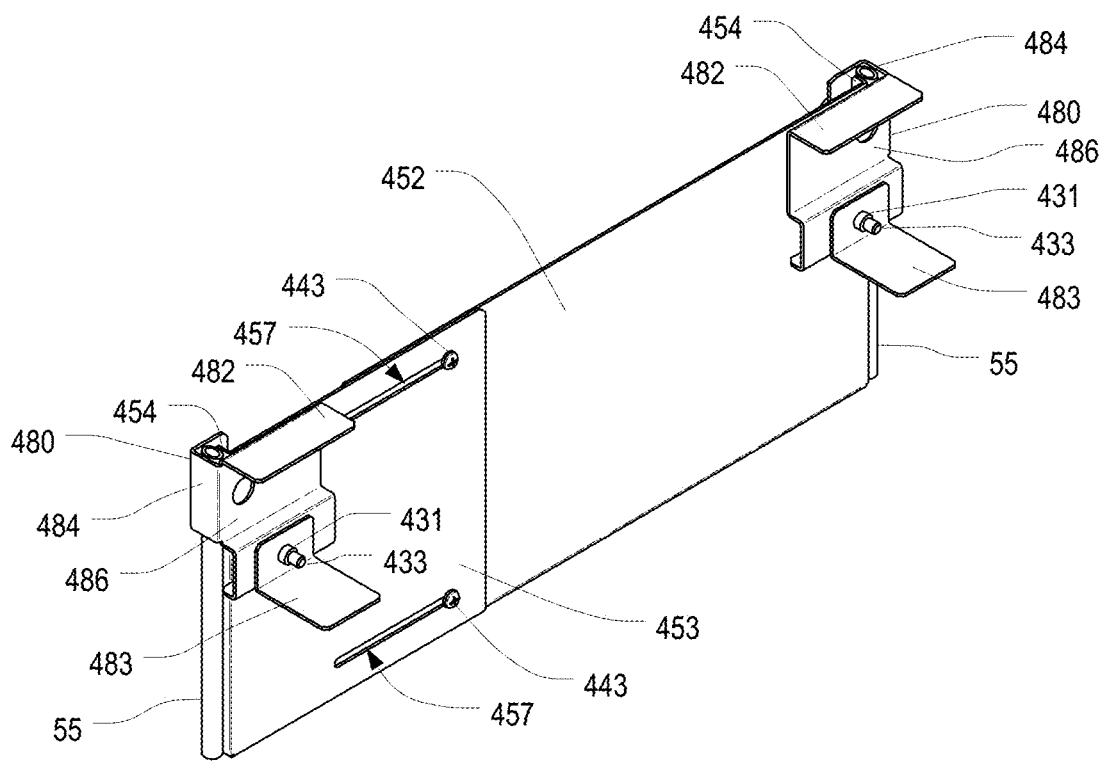
Figure 18C:
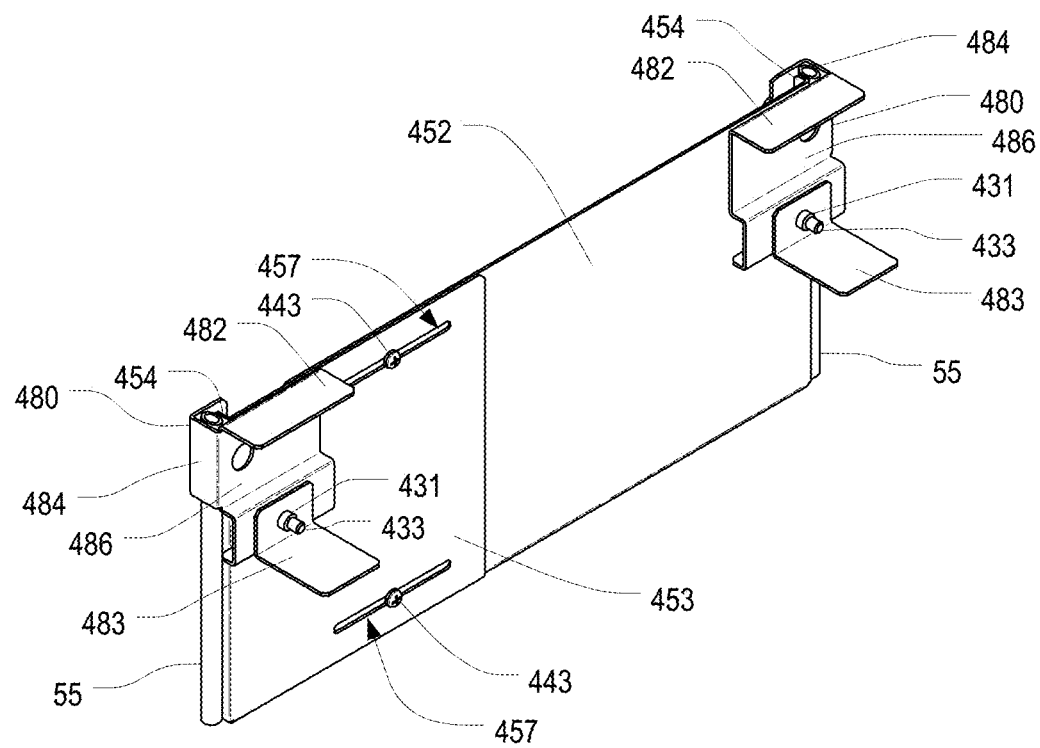
Figure 18D:
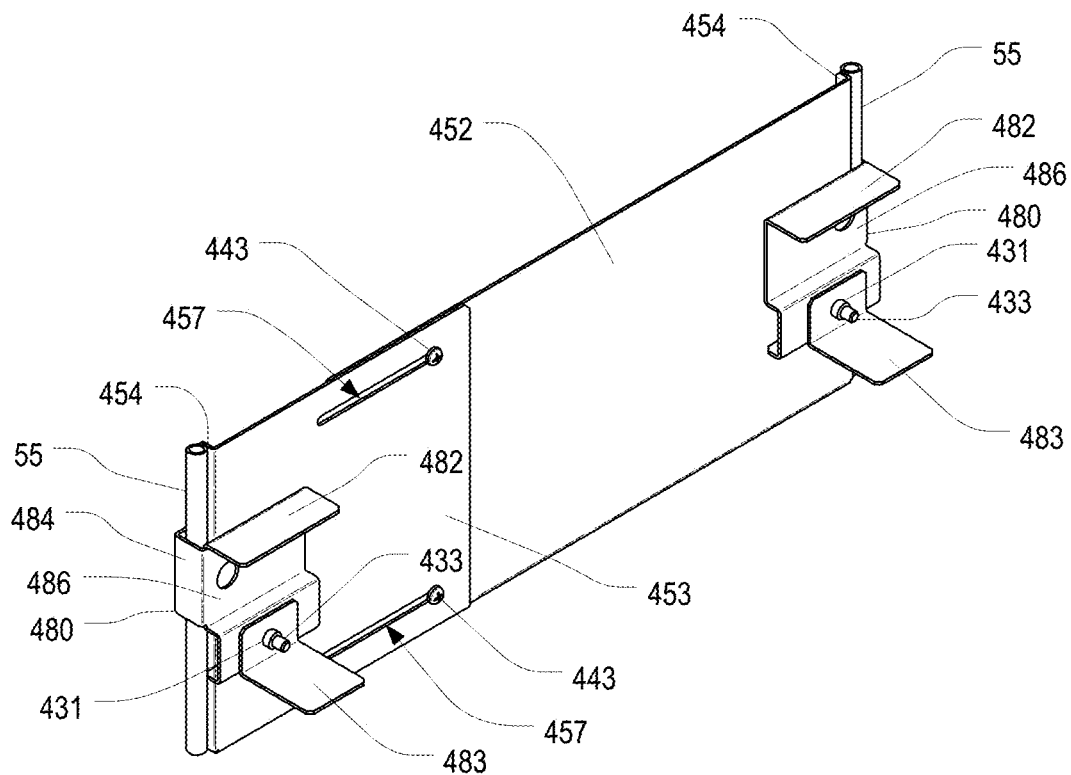
Figure 19:
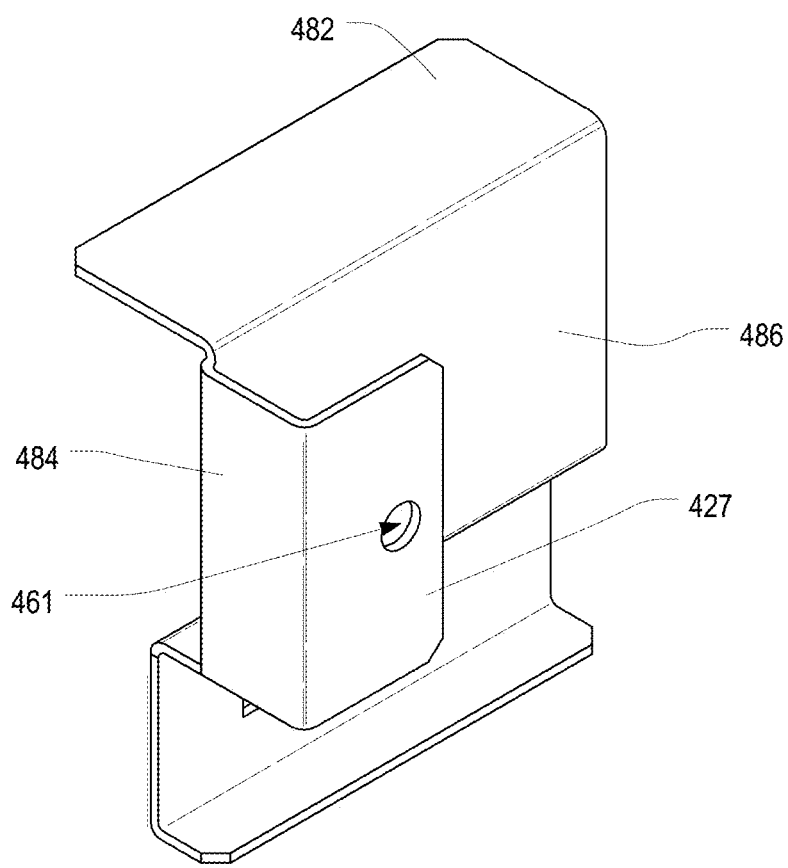
FIG. 19 is an isometric view of the fixed bracket on the left side of the header panel assembly of FIG. 18A.
Figure 25:
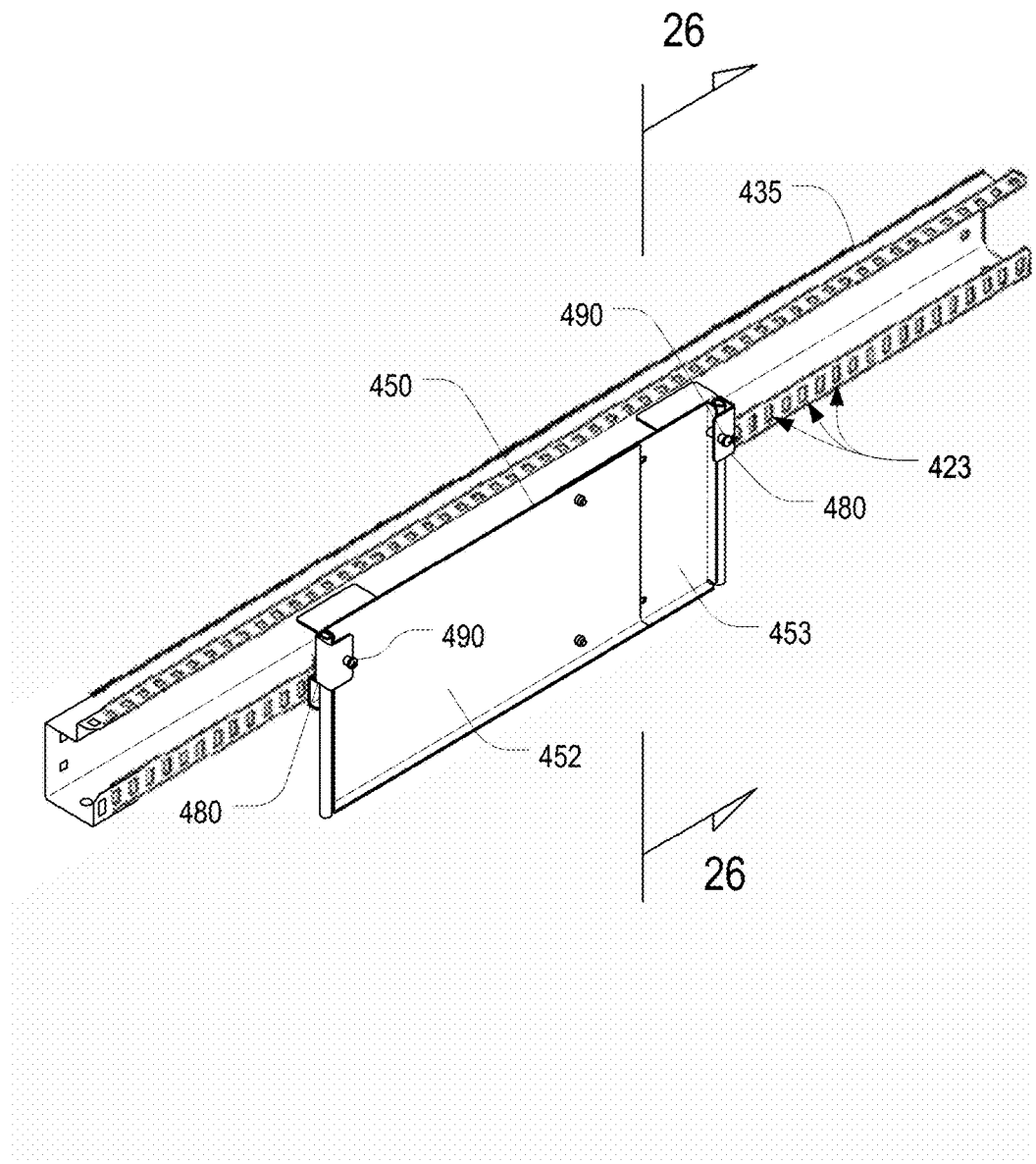
FIG. 25 is an isometric view of the header panel assembly of FIGS. 18A-18D attached to another overhanging beam, for use in a hot/cold aisle air containment system, in accordance with another embodiment of the present invention.
Figure 26:
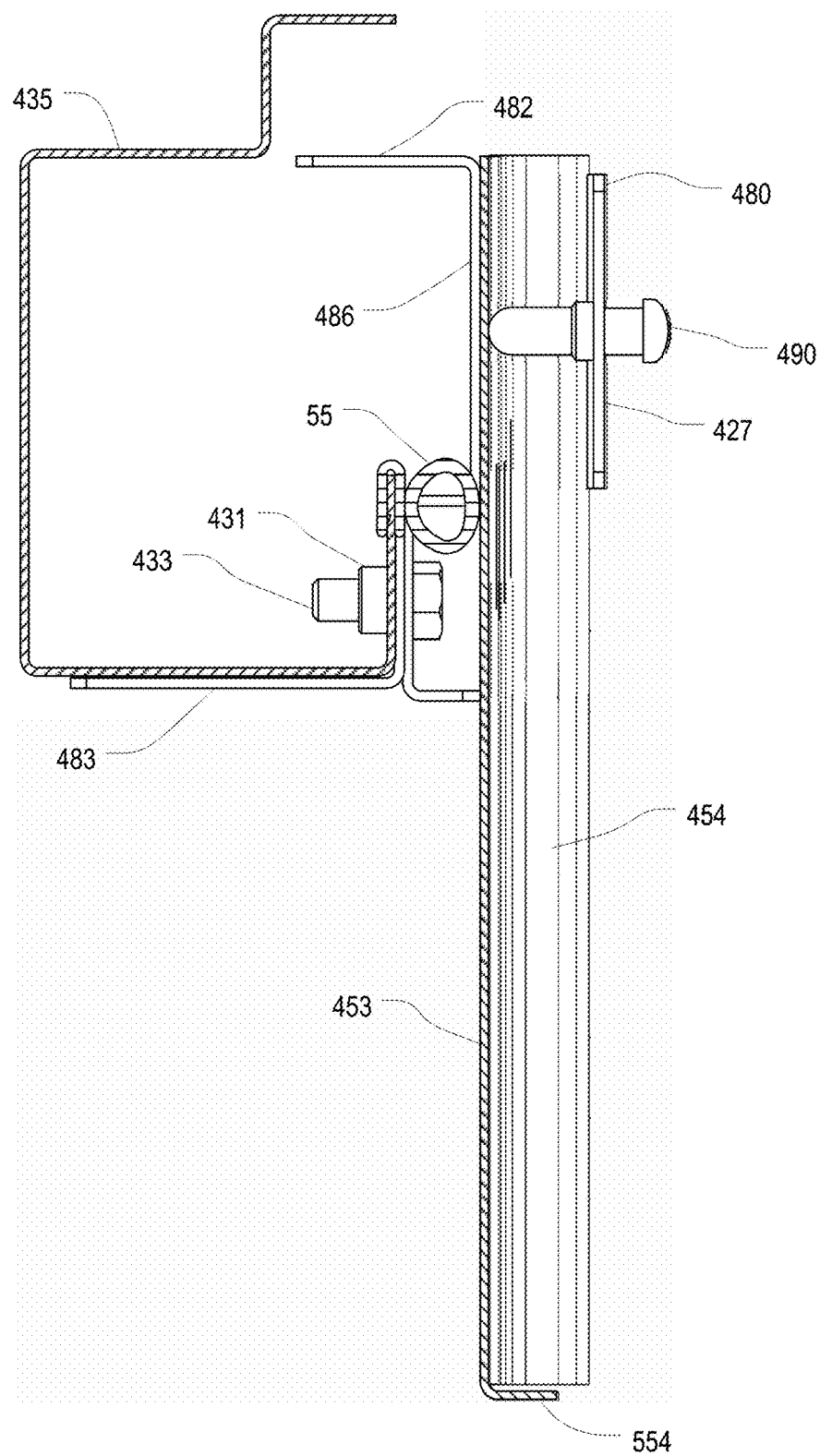
FIG. 26 is a side cross-sectional view of the overhanging beam and header panel assembly of FIG. 25, taken along line 26-26.

FIG. 19 is an isometric view of the fixed bracket 480 on the left side of the header panel assembly 450 of FIG. 18A. With reference to FIG. 19 and FIGS. 18A-18D, each of the pair of fixed brackets 480 of the header panel assembly 450 includes a top flange 482 and a side retention flange 484, each extending from a main body 486. Separate mounting brackets 483 (shown in FIGS. 18A-18D) facilitate attachment of the fixed brackets 480 to one or more horizontal beams or rails 435 of a frame structure 412, as shown in FIGS. 25 and 26. The side retention flanges 484 are adapted to receive an edge of a main or secondary panel 452,453 as more fully described hereinbelow. Each fixed bracket 480 also includes an extension flange 427 extending perpendicularly from the side retention flange 484. With particular reference to FIGS. 18A and 19, the extension flanges 427 are each penetrated by a clamp aperture 461 adapted to receive a clamp fastener 490. It is contemplated that a wide variety of different clamp structures and mechanisms may be utilized. In the embodiment depicted in FIGS. 18A-18D, the clamp fastener 490 is a threaded fastener that may be clamped into position with a nut attached behind and around the aperture 461. In other embodiments, it is contemplated that cam locks, spring fasteners or any of a range of other mechanisms may be implemented to accomplish the clamping function.

As will be appreciated, the main and secondary panels 452,453 may be held in place against the fixed brackets 480 by tightening the clamp fasteners 490 through the apertures 461 in the extension flanges 427 until the end of one clamp fastener 490 is forced against the body of the main panel 452 and the end of the other clamp fastener 490 is forced against the body of the secondary panel 453. In order to preserve structural integrity of the main and secondary panels 452, 453, ends of the clamp fasteners 490 may be fitted with protective end caps. In at least some embodiments, the clamp fasteners 490 are similar to, or utilize features of, the clamps 90 described, for example, with reference to FIGS. 5 and 10.

The header panel assembly 450 is also adjustable vertically so as to be customizable to occupy spaces with varying height requirements. The vertical dimension of the header panel assembly 450 may be adjusted by loosening the clamp fasteners 490 and sliding the main and secondary panels 452,453 up or down relative to the fixed brackets 480 before retightening the clamp fasteners 490. The clamp arrangement permits infinite adjustment of the vertical position of the main and secondary panels 452,453 relative to the fixed brackets 480 (within a range determined by the dimensions of the main and secondary panels 452,453 and brackets 480), and, thus, allows the header panel assembly 450 to be customized to fit the space between the top of an enclosure 414 and the frame structure 412 as shown in FIG. 17.

As can now be understood, and with reference to FIGS. 18A-18D, the header panel assembly 450 is capable of adjustment in both the horizontal and vertical dimensions in order to be customized to fit the space between the top of an enclosure 414 and the frame structure 412. In FIG. 18B, the header panel assembly 450 is shown in a wide configuration, with the fasteners 443 positioned at the ends of the slotted openings 457 of the secondary panel 453. In FIG. 18C, the secondary panel 453 is shifted, in a telescoping manner, against the main panel 452 such that the fasteners 443 are positioned generally in the middle of the slotted openings 457. The width of the header panel assembly configuration of FIG. 18C is less than that of the configuration of FIG. 18B. In FIG. 18D, the width of the header panel assembly 450 is the same as shown in FIG. 18B, but the main and secondary panels 452,453 are shifted vertically, relative to the fixed brackets 480, so as to adjust the vertical dimension (height) of the header panel assembly 450, and thereby be customized to fill a space having a particular height, such as the space above an enclosure having a different height requirement.

As further shown in FIG. 18A, the main and secondary panels 452,453 each have an outer side flange 454 and a lower edge flange 554, each of which may have any of a wide range of shapes and configurations, including those discussed above in connection with FIGS. 10-13. In each case, the flanges 454,554 may be fitted with seals 55 in like manner to the embodiments of FIGS. 10-13. Seals 55 may be made from a compressible material of any type conventionally utilized for gaskets, seals, brushes or the like. In at least one contemplated embodiment, seals 55 are ethylene propylene diene monomer (EPDM) rubber seals. When the main and secondary panels 452,453 are positioned within the side retention flanges 484 of the fixed brackets 480, the seals 55 extend from the edges of the main and secondary panels 452,453 and are in a position to abut an adjacent structure, thereby forming a seal against it. As shown in FIGS. 18A-18D, at least a portion of the seals 55 at the outer side flanges 454 of the main and secondary panels 452,453 is compressed by the side retention flanges 484 of the fixed brackets 480. It will be appreciated that when the header panel assembly 450 is properly installed in place next to another header panel assembly, a side seal assembly or another structure, the entire extent of the seal 55 will usually be compressed as well, thereby sealing the header panel assembly 450 against the respective structure.

The header panel assembly 450 may be manufactured from a wide variety of different materials. In at least one contemplated embodiment, at least some components of the header panel assembly 450 are manufactured from 1008 CRS steel.

In another contemplated embodiment, the panel or panels of the header panel assembly 450 may be made from a field-cut material. In this manner, the header panel assembly 450 may be customized on-site to fit a particular space above an enclosure.

Figure 20:
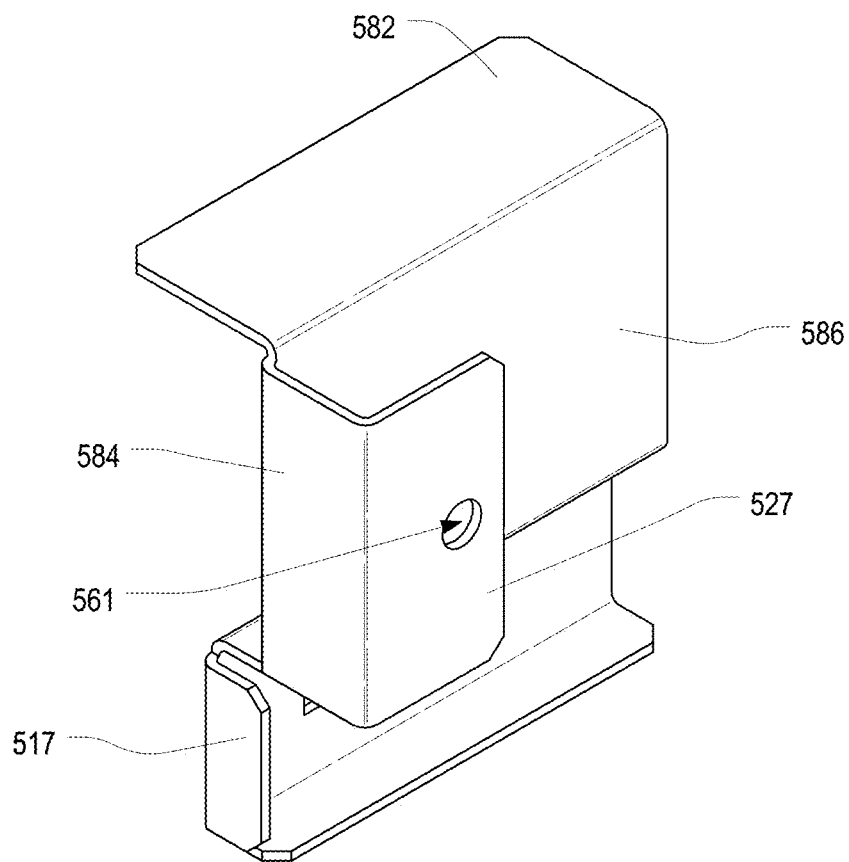
FIG. 20 is an isometric view of another embodiment of a fixed bracket for use in connection with a header panel assembly in accordance with one or more preferred embodiments of the present invention.

FIG. 20 is an isometric view of another embodiment of a fixed bracket 580 for use in connection with a header panel assembly in accordance with one or more preferred embodiments of the present invention. The fixed bracket 580 of FIG. 20 functions in much the same manner as the fixed bracket 480 of FIGS. 18A-18D and 19. The fixed bracket 580 includes a top flange 582 and a side retention flange 584, each extending from a main body 586. A separate mounting bracket (not illustrated, but similar to the mounting bracket 483 of FIGS. 18A-18D) facilitates attachment of the fixed bracket 580 to one or more horizontal beams or rails of the frame structure. When paired with a similar fixed bracket having a side retention flange at an opposite side thereof, the side retention flanges 584 of the pair of fixed brackets 580 are adapted to receive the main and secondary panels 452,453 of a header panel assembly 450 in similar manner to the embodiment of FIGS. 18A-18D. The fixed bracket 580 also includes an extension flange 527 extending generally perpendicularly from the side retention flange 484. The extension flanges 527 are each penetrated by a clamp aperture 561 adapted to receive a clamp fastener 490 to clamp the main and secondary panels 452,453 into position. Notably, unlike the fixed bracket 480 of FIG. 19, however, the fixed bracket 580 shown in FIG. 20 also includes an end flange 517 extending from a lower portion of the main body 586. This may, for example, provide extra strength, rigidity, or the like.

Figure 21:
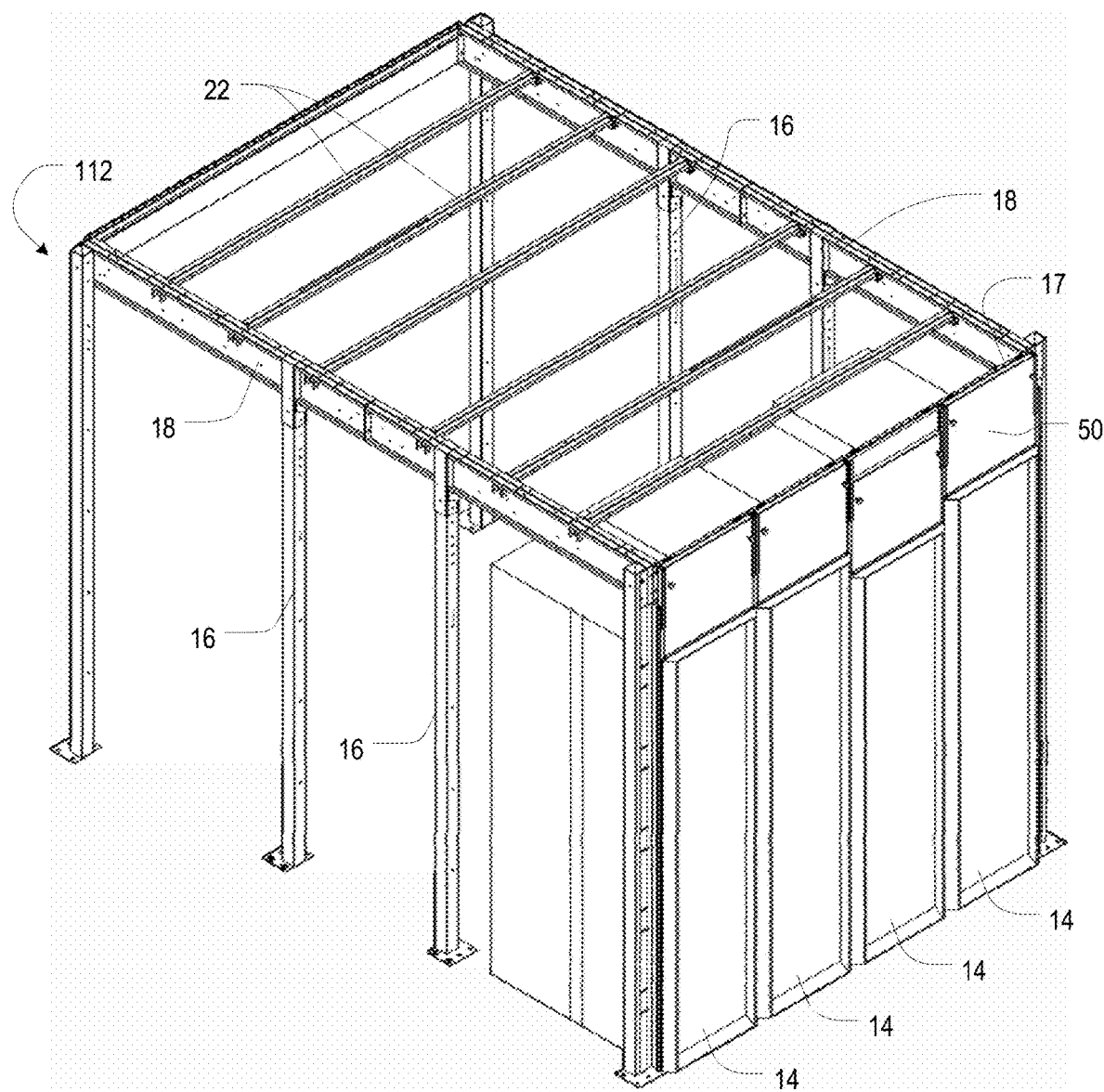
FIG. 21 is an isometric view of a hot/cold aisle air containment system in use with a row of electronic equipment enclosures in accordance with one or more preferred embodiments of the present invention.

The header panel assemblies described herein may be used in a wide variety of hot/cold aisle air containment systems, some of which are described and illustrated herein. For example, FIG. 21 is an isometric view of a hot/cold aisle air containment system 110 in use with a row of electronic equipment enclosures 14 in accordance with one or more preferred embodiments of the present invention. In particular, the containment system 110 of FIG. 21, relative to that of FIG. 1, includes a larger and more comprehensive frame structure 112 adapted to receive and support various panels and other structures to more fully enclose a hot or cold aisle behind the enclosures 14. This frame structure 112 includes additional vertical posts 16 and horizontal beams 17,18 as well as a plurality of horizontal joists 22. Other such frame structures, suitable for use with the header panel assemblies 50,450 in accordance with one or more preferred embodiments of the present invention, are described in commonly-assigned U.S. provisional patent application 61/411,359, entitled, "ADJUSTABLE WALL ASSEMBLY FOR HOT/COLD AISLE CONTAINMENT SYSTEM," a copy of which is attached as Appendix A.

Figure 22:
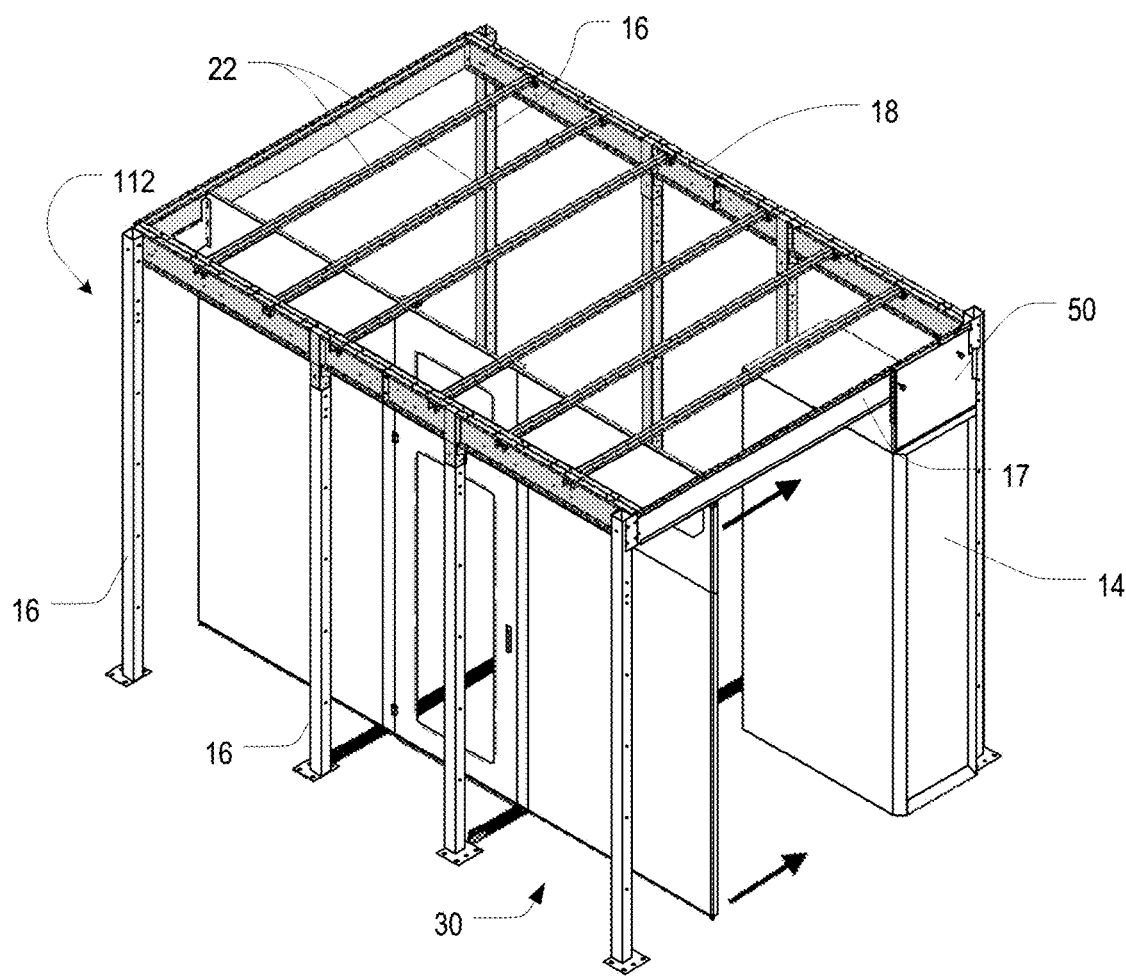
FIG. 22 is an isometric view of a hot/cold aisle air containment system in use with an electronic equipment enclosure installed at one side thereof and an adjustable wall assembly temporarily positioned away from the enclosure in accordance with still another preferred embodiment of the present invention.

An example of an assembly of panels to form a wall is shown in FIG. 22, which is an isometric view of a hot/cold aisle air containment system 210 in use with an electronic equipment enclosure 14 and an adjustable wall assembly 30 in accordance with still further embodiments of the present invention. The enclosure 14 is installed at one end of the frame structure 112 and the adjustable wall assembly 30 is temporarily positioned away from the enclosure 14 but can be moved toward the enclosure 14 to seal off the front end of the enclosure and the space behind it. Adjustable wall assemblies suitable for use with the frame structure 112 and header panel assemblies 50,450 in accordance with one or more preferred embodiments of the present invention are described in the aforementioned '359 patent application, attached as Appendix A.

Returning to FIG. 17, the hot/cold aisle air containment system 410 shown therein includes a pair of rows of electronic equipment enclosures 414,415 installed at opposite sides thereof and the header panel assembly 450 of FIGS. 18A-18D installed above one of the enclosures 415 to fill the space between the top of the enclosure 415 and the frame structure 412 or other structure above it. Advantageously, the header panel assembly 450 may be used in conjunction with a row of enclosures 414 in a hot/cold aisle air containment system 410, where various enclosures within the row have a different height and/or width than other enclosures. The header panel assembly 450 may then be customized so as to contain and seal air from one side of the enclosure, thereby preventing recirculation to the other side of the enclosure in the containment system. In this manner, exhaust air can effectively be sealed off and prevented from mixing with a supply of cool air at the equipment intake. The header panel assembly 450 is capable of use in connection with each of a "cold aisle" containment roof system or with a "hot aisle" containment chimney system, as well as other arrangements and configurations of containment systems. By facilitating two dimensions of adjustability in a header panel assembly, a single part number is capable of supporting many cabinet width and height variations in or to the hot aisle or cold aisle air containment system. The range of adjustability in both horizontal and vertical dimensions ensures that both horizontal and vertical air gaps may be substantially entirely eliminated, and differences in enclosure heights and widths may be managed effectively. Such variability is illustrated, for example, in FIG. 17, where one enclosure 415 is shorter than other enclosures 414 in the row.

Figure 23:
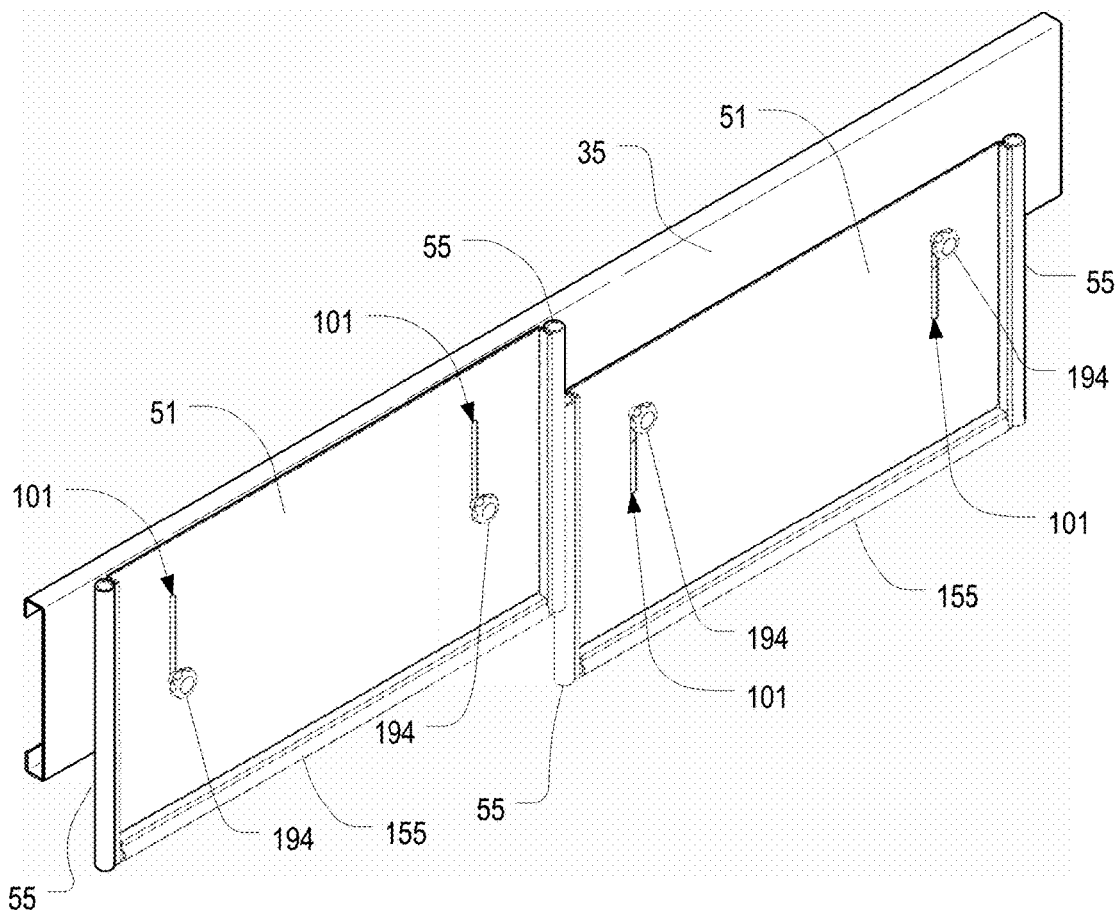
FIG. 23 is an isometric view of a pair of adjustable header panels attached to an overhanging beam, for use in a hot/cold aisle air containment system, in accordance with another embodiment of the present invention.

Furthermore, though depicted in the context of an air containment system, it is contemplated that the header panel assembly 450 may be used as part of a frame structure comprising only a single horizontal beam, a frame structure comprising a collection of interconnected horizontal beams, or the like. For example, FIG. 23 is an isometric view of a pair of adjustable header panels 51 attached to an overhanging beam 35, for use in a hot/cold aisle air containment system, in accordance with another embodiment of the present invention. As shown therein, the overhanging beam 35 accommodates one or more header panels 51, each of which includes one or more adjustment slots 101. The header panels 51 are mounted directly to the overhanging beam 35 via clamps 194, each extending through a respective adjustment slot 101 of the header panel 51 and into a respective clamp aperture (not illustrated) of the overhanging beam 35. The clamps 194 permit the header panel 51 to be adjusted vertically relative to the overhanging beam 35.

By loosening the clamps 194 of a selected one of the header panels 51, the header panel 35 has infinite adjustability (within the dimensional range allowed by the adjustment slots 101). Tightening the clamps 194 fixes the header panel 51 into any desired position.

The header panels 51 share many characteristics with the main panel 52 of the header panel assembly 50 of FIGS. 3-6. Each header panel 51 is generally flat with generally perpendicular flanges 53,153 along the sides and bottom thereof. Each perpendicular flange 53,153 defines an outer edge to accommodate and retain a respective seal 55,155. Each seal 55,155 includes a mounting portion 57 adapted to attach to the edge of the perpendicular flange 53,153. A boss (not illustrated) may be provided on the mounting portion 57 to assist in attaching the mounting portion 57 snugly around the edge of the perpendicular flange 53,153. Each seal 55,155 further includes a body portion 58 comprised of a compressible material of any type conventionally utilized for gaskets, seals, brushes or the like. While a compressible seal is depicted in FIG. 23, it is contemplated that a wide variety of different seals, including brush seals and deflectable blade seals, may be used in connection with the header panels 51. Furthermore, while the flanges 53,153 are shown as generally perpendicular, it is contemplated that the flanges 53,153 may have any of a wide variety of different shapes and configurations, including V-shaped flanges and angled flanges. The seals 55,155 extend from the edges of the header panel 51 and are in a position to abut an adjacent structure so as to form a seal therewith.

Figure 24:
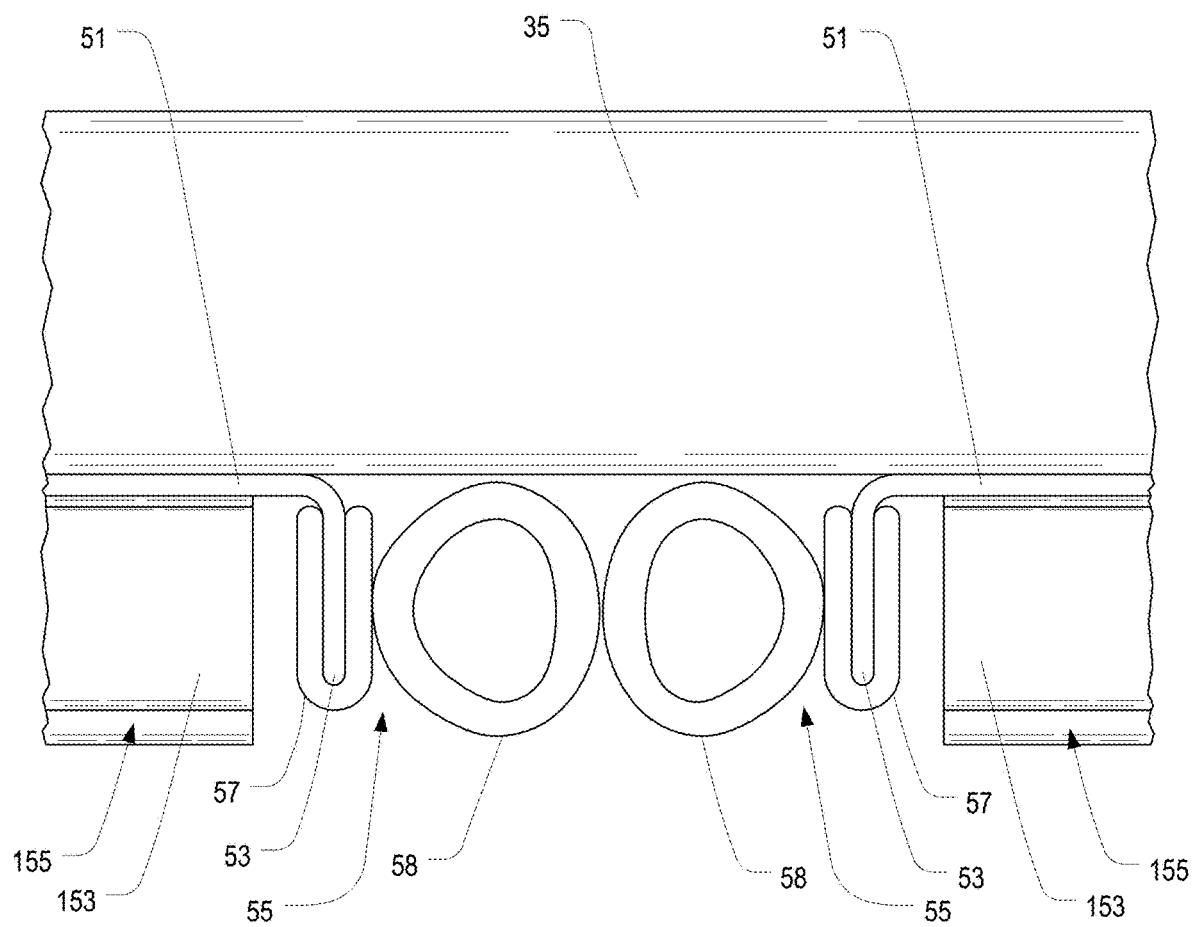
FIG. 24 is a fragmentary top view of adjacent edges of the pair of adjustable header panels of FIG. 23.

FIG. 24 is a fragmentary top view of adjacent edges of the pair of adjustable header panels 51 of FIG. 23. As shown therein, the seals 55 of adjacent header panels 51 abut one another, thereby compressing the body portions 58 of each seal 55 and sealing off the boundary between adjacent header panels 51.

When installed above an enclosure 14 in a containment system and adjusted into position against the enclosure 14, the header panel 51 can effectively block the space above the enclosure 14 and prevent recirculation of heated air from the rear of the enclosure 14 over the top thereof where it could mingle with the cooling air being provided to the enclosure front. With multiple header panels 51 installed, the header panels 51 not only establish a seal with one another but may also be selectively adjusted to different heights, as depicted in FIG. 23, so as to accommodate varying heights among the enclosures installed in the containment system. The infinite adjustability (within the dimensional range) ensures that air gaps may be substantially entirely eliminated, and differences in enclosure heights managed effectively. Furthermore, by mounting the header panels 51 directly to the overhanging beam 35, the need for a separate telescoping panel to accompany the header panel 51 may be avoided.

FIG. 25 is an isometric view of the header panel assembly 450 of FIGS. 18A-18D attached to another overhanging beam 435, for use in a hot/cold aisle air containment system, in accordance with another embodiment of the present invention; and FIG. 26 is a side cross-sectional view of the overhanging beam 435 and header panel assembly 450 of FIG. 25, taken along line 26-26. As shown in FIG. 25, the horizontal beam 435 accommodates the fixed brackets 480 of the header panel assembly 450. The fixed brackets 480 are permitted to be adjusted, independently of one another, in a lateral direction along the horizontal beam 435 so as to be capable of accommodating varying widths of the header panel assembly 450. As perhaps best shown in FIG. 26, a fastener 433 for each fixed bracket 480 extends through an aperture of the main body 486 of the fixed bracket 480, through a corresponding aperture of the mounting bracket 483, and through a mounting aperture 423 (shown in FIG. 25) of the horizontal beam 435. Alternately, the fastener 433 for each fixed bracket 480 may extend through an aperture of the main body 486 of the fixed bracket 480, through a mounting aperture 423 of the horizontal beam 435, and then through a corresponding aperture of the mounting bracket 483 at the opposite side of the horizontal beam 435. In each embodiment, a nut 431 may be used to tighten the fastener 433 and thereby clamp the fixed bracket 480 into position along the horizontal beam 435. Fixed brackets 480 can be repositioned to accommodate a different width by unfastening the bracket 480 and refastening the bracket 480 through a different mounting aperture 423 of the horizontal beam 435. Furthermore, the position of the panels 452,453 may be adjusted vertically, as described, for example, with reference to FIG. 18D, by loosening clamp fasteners 490, adjusting the vertical position of the panels 452,453 within the fixed brackets 450, and then retightening the clamp fasteners 490.

As shown in FIG. 26, a seal 55 may be installed along an edge of at least a portion of the horizontal beam 435 in order to establish a seal between the horizontal beam 435 and the rear of the main and secondary panels 452,453 of the header panel assembly 450. The seal 55 may be installed in like manner to the embodiments of FIGS. 10-13. Seals 55 may be made from a compressible material of any type conventionally utilized for gaskets, seals, brushes or the like. In at least one contemplated embodiment, seals 55 are EPDM rubber seals. When the header panel assembly 450 is installed along the horizontal beam 435, the main and secondary panels 452,453 engage with and compress the seal 55 along the horizontal beam 435, thereby sealing the rear of the header panel assembly 450 against the horizontal beam 435.

In at least some embodiments, an overhanging or horizontal beam 35,435 may be mounted horizontally in a containment system having a row of enclosures to provide another sealing option.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A header panel assembly for use in preventing circulation of air above an electronic equipment enclosure, comprising:
   a pair of fixed brackets, each including a retention flange extending from a main body and adapted to be supported by a horizontal member of a frame structure of a hot/cold aisle containment system, the pair of fixed brackets including a left fixed bracket and a right fixed bracket; and a pair of header panels adjustably coupled to one another such that a first of the pair of panels is adjustable horizontally relative to a second of the pair of panels, the pair of header panels including a left end and a right end, wherein the left end is disposed within the retention flange of the left fixed bracket and the right end is disposed within the retention flange of the right fixed bracket;

wherein the fixed brackets are horizontally spaced apart from each other over an electronic equipment enclosure, and the header panels are correspondingly adjusted horizontally, such that the assembly has a desired width, thereby preventing circulation of air over the electronic equipment enclosure.

2. The header panel assembly of claim 1, wherein the pair of panels, together, is adjustable relative to the pair of fixed brackets.

3. The header panel assembly of claim 2, wherein each retention flange extends around a respective end of the pair of header panels.

4. The header panel assembly of claim 3, wherein each retention flange includes a side retention flange extending perpendicularly from the main body and an extension flange extending perpendicularly from each side retention flange such that a respective end of the pair of header panels fits between the main body and the extension flange.

5. The header panel assembly of claim 3, wherein a respective seal is disposed along each end of the pair of header panels, and wherein each respective retention flange extends around the respective seal.

6. The header panel assembly of claim 2, wherein each fixed bracket includes a clamp fastener that retains the fixed bracket at a desired vertical location along a respective end of the pair of header panels.

7. The header panel assembly of claim 6, wherein each clamp fastener is supported by the respective retention flange.

8. The header panel assembly of claim 7, wherein each clamp fastener is threaded through an aperture in the respective retention flange.

9. The header panel assembly of claim 6, wherein a portion of the clamp fastener bears against a surface of a respective one of the pair of header panels to retain the fixed bracket at the desired vertical location.

10. The header panel assembly of claim 2, wherein the main body of each fixed bracket includes an offset portion that is attachable to the horizontal member for support of the header panel assembly thereby.

11. The header panel assembly of claim 10, wherein the offset portion provides room for a fastener used to attach the offset portion to the horizontal member.

12. The header panel assembly of claim 10, wherein the offset portion provides room for a seal to be positioned between the pair of panels and the horizontal member.

13. The header panel assembly of claim 2, wherein a respective L-shaped mounting bracket facilitates attachment of each fixed bracket to the horizontal member.

14. A header panel assembly for use in preventing circulation of air above an electronic equipment enclosure, comprising:

a pair of fixed brackets, each including a main body having an offset portion, that is adapted to be supported by a horizontal member of a frame structure of a hot/cold aisle containment system by attaching the offset portion to the horizontal member for support of the header panel assembly thereby, the pair of fixed brackets including a left fixed bracket and a right fixed bracket; and a pair of header panels adjustably coupled to one another such that a first of the pair of panels is adjustable horizontally relative to a second of the pair of panels, the pair of header panels including a left end and a right end, wherein the left end is disposed within the retention flange of the left fixed bracket and the right end is disposed within the retention flange of the right fixed bracket;

wherein the fixed brackets are horizontally spaced apart from each other over an electronic equipment enclosure, and the header panels are correspondingly adjusted horizontally, such that the assembly has a desired width, thereby preventing circulation of air over the electronic equipment enclosure.

15. The header panel assembly of claim 14, wherein the pair of panels, together, is adjustable relative to the pair of fixed brackets.

16. The header panel assembly of claim 15, wherein the offset portion provides room for a fastener used to attach the offset portion to the horizontal member.

17. The header panel assembly of claim 15, wherein the offset portion provides room for a seal to be positioned between the pair of panels and the horizontal member.

18. A header panel assembly for use in preventing circulation of air above an electronic equipment enclosure, comprising:

a pair of fixed brackets, each including a main body and a clamp fastener, that is adapted to be supported by a horizontal member of a frame structure of a hot/cold aisle containment system, the pair of fixed brackets including a left fixed bracket and a right fixed bracket; and a pair of header panels adjustably coupled to one another such that a first of the pair of panels is adjustable horizontally relative to a second of the pair of panels, the pair of header panels including a left end and a right end, wherein the left end is disposed within the retention flange of the left fixed bracket and the right end is disposed within the retention flange of the right fixed bracket;

wherein the clamp fastener of each fixed bracket retains the fixed bracket at a desired vertical location along a respective end of the pair of header panels; and wherein the fixed brackets are horizontally spaced apart from each other over an electronic equipment enclosure, and the header panels are correspondingly adjusted horizontally, such that the assembly has a desired width, thereby preventing circulation of air over the electronic equipment enclosure.

19. The header panel assembly of claim 18, wherein the pair of panels, together, is adjustable relative to the pair of fixed brackets.

20. The header panel assembly of claim 19, wherein each clamp fastener is threaded through an aperture in a flange extending from the main body of the respective fixed bracket and bears against a surface of the respective one of the pair of header panels to retain the fixed bracket at the desired vertical location.

* * * * *